United States Patent [19]
Hino et al.

[11] Patent Number: 6,036,346
[45] Date of Patent: Mar. 14, 2000

[54] SEMICONDUCTOR MANUFACTURING PROCESS SIMULATION APPARATUS FOR CALCULATING A PRESSURE FIELD GENERATED BY A DISLOCATION LOOP

[75] Inventors: Takeshi Hino, Natori; Toshihiro Hyodo, Ikeda, both of Japan

[73] Assignee: Ricoh Company, Ltd., Tokyo, Japan

[21] Appl. No.: 08/859,265

[22] Filed: May 20, 1997

[30] Foreign Application Priority Data

May 20, 1996 [JP] Japan ................................ 8-124872
Jul. 31, 1996 [JP] Japan ................................ 8-202075

[51] Int. Cl.$^7$ .................................................. G06F 19/00
[52] U.S. Cl. ........................... 364/468.28; 364/468.03; 364/578
[58] Field of Search ................ 364/468.03, 468.04, 364/468.28, 578, 488–491; 395/500; 438/5, 14

[56] References Cited

U.S. PATENT DOCUMENTS 5,737,250   4/1998   Sawahata .................... 364/468.04 X
5,787,269   7/1998   Hyodo ................................ 395/500

FOREIGN PATENT DOCUMENTS 8-148400   6/1996   Japan .

OTHER PUBLICATIONS

*"A Point Defect Based Two–Dimensional Model of the Evoution of Dislocation Loops in Silicon during Oxidation," S. H. Park, K. S. Jones, and M.E. Law, Electrochem. Soc., vol. 141, 1994, pp. 759–765.
"The Effects of Strain on Dopant Diffusion in Silicon," IDEM 93, pp. 303–306; 1993.
"Two–Dimensional Model of Dislocation Loops in Silicon," ECS Honolulu, 1993, Process Physics Symposium.
"Evolution of Dislocation Loops in Silicon in an Inert Ambient–I," Solid–State Electronics, vol. 38, No. 7, pp. 1305–1312; 1995.
"A Study of Point Defects Created by Si and Ge Implantation," J. Applied Physics 73(2), Jan. 1993, pp. 955–960.
"Using Oxidation To Study the Reaction Between Point Defects and Dislocation Loops," ECS Honolulu 1993, Process Physics Symposium.
"Modeling the Growth and Annealing of Dislocation Loops,"L. Borucki, NUPAD IV–27, Seattle, WA, May 31, 1992.
"A Study On the Dislocation Loop Growth and Boron Redistribution During The Post Implantation Annealing," K.. Uwasawa et al., Technical Report of IEICE, ED94–50, SDM–87, VLD94–47 (1994–09); 1994.
"A New Boron Diffusion Model Incorporating The Dislocation Loop Growth," K. Uwasawa et al., IEDM 94, pp. 873–876; 1994.

(List continued on next page.)

*Primary Examiner*—Joseph Ruggiero
*Attorney, Agent, or Firm*—Dickstein Shapiro Morin & Oshinsky LLP

[57] ABSTRACT

A semiconductor manufacturing process simulation apparatus using a diffusion model in which a dislocation loop generated in a crystalline substrate during an ion implantation process of a semiconductor manufacturing process is considered with respect to a diffusion in a heat treatment process subsequent to the ion implantation process. An ion implantation process simulating part simulates an ion implantation process. A model generating part generates a diffusion model in which contribution of dislocation loops is considered, the dislocation loops being formed in the substrate during the ion implantation process. A heat treatment process simulating part simulates a heat treatment process subsequent to the ion implantation process, the diffusion model generated by the model generating part being used for simulating diffusion of impurities in the substrate during the heat treatment process. A pressure field generated by the dislocation loops in the substrate is defined in the diffusion model by a function of a distance from a layer in which the dislocation loops are formed.

21 Claims, 17 Drawing Sheets

OTHER PUBLICATIONS

"The Self–Force on a Planar Dislocation Loop In An Anisotropic Linear–Elastic Medium," S.D. Gavazza, J. Mech. Phys. Solids, 1976, vol. 24, pp. 171–185.

"The Kinetic Migration of Impurities to Small Dislocation Loops," R. Bullough et al., Metal Science Journal, 1968, vol. 2.

"Point Defect Detector Studies of Oxidized Silicon," H. L. Meng et al., Mat Res. Soc. Symp. Proc. vol. 138, 1992.

"Experimental Investigation and Modeling of the Role of Extended Defects During Thermal Oxidation,"R.Y.S. Husng and R.W. Dutton, J. Appl. Phys. 47(9), Nov. 1, 1993, pp. 5821–5827.

"Dislocation Climb Force,"J. Lothe and J. P. Hirth, Journal of Applied Physics, vol. 38, No. 2, Feb. 1967, pp. 845–848.

"Elastic Interaction of Dislocation Loops and Point Defects,"J. Bastecka and F. Kroupa, Czech. J. Phys. B 14(1964), pp. 443–453.

"Circular Edge Dislocation Loop," F. Kroupa, Czech. J. Phys. B 10(1960), pp. 284–293.

FIG. I PRIOR ART
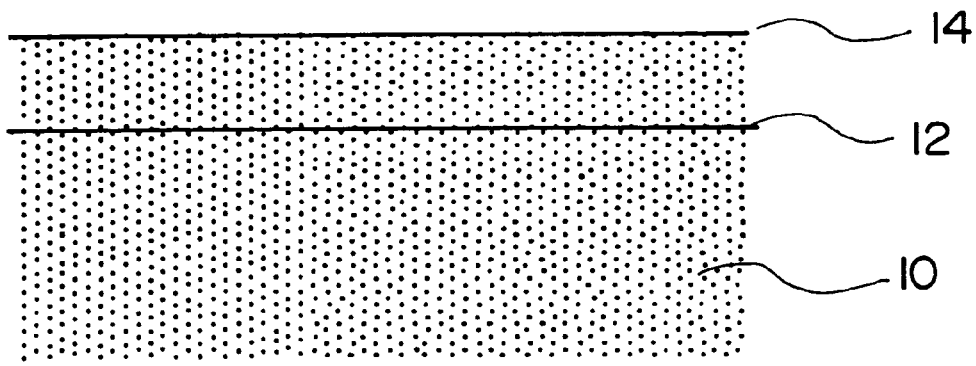
FIG. 2 PRIOR ART
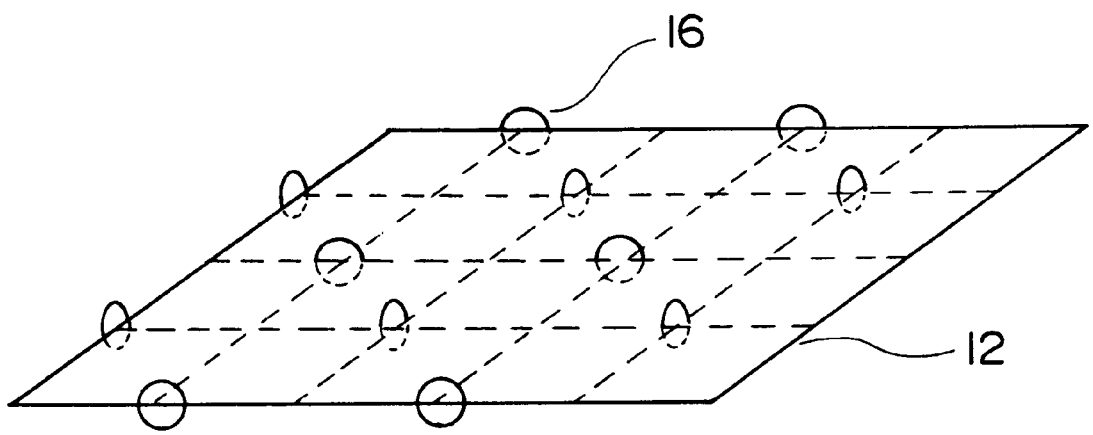

ELLIPTIC ARC SEGMENT AREA | LINE SEGMENT AREA

SEMICONDUCTOR MANUFACTURING PROCESS SIMULATION APPARATUS FOR CALCULATING A PRESSURE FIELD GENERATED BY A DISLOCATION LOOP

BACKGROUND OF THE INVENTION

1. Field of the Invention

The present invention relates to a simulation apparatus for simulating a process of manufacturing a semiconductor device and, more particularly, to a semiconductor manufacturing process simulation apparatus using a diffusion model in which an influence of a dislocation loop generated within a crystalline substrate during an ion implantation process is considered with respect to diffusion in a heat treatment process subsequent to the ion implantation process.

2. Description of the Related Art

In the recent development work of semiconductor devices, a semiconductor manufacturing process simulation apparatus plays an important role. Commercially available process simulation apparatuses have become popular, and are used by persons working on a semiconductor device developments However, simulation models used in the commercially available process simulation apparatuses are incomplete with respect to a physical aspect, and there are many cases in which matching of parameters for simulation is needed for each process performed in a manufacturing process of a semiconductor device.

Particularly, a temperature of a heat treatment process has been decreased in recent years. A crystal defect in a silicon wafer did not have an influence in a conventional manufacturing process using a high temperature for a heat treatment process. However, in the heat treatment process using a low temperature, it is considered that a crystal defect of a silicon wafer influences diffusion of impurities during a heat treatment process.

A crystal dislocation loop related to the present invention influences diffusion of impurities in a heat treatment process using a low temperature. However, the influence of such a crystal dislocation loop is not considered in the commercially available semiconductor manufacturing process simulation apparatus. Additionally, there is no method announced in publicly known literature such as a treatise or a patent publication that indicates practical use of a model of a crystal dislocation loop for a two-dimensional semiconductor manufacturing process simulation apparatus.

It should be noted that a series of treatises have been published by Mark E. Law and his group which relate to a semiconductor manufacturing process simulation apparatus using a impurity diffusion model considering dislocation loops generated in a crystal structure due to ion implantation.

An example of the recent publication is "J.Electrochem. Soc., Vol. 141, 759 (1994)" by H. Park, K. S. Jones and M. E. Law. In the series of treatises, influence of dislocation loops in an impurity diffusion model is described. However, no consideration was made with respect to a method regarding how to define and input location of a dislocation loop and to which process influence or contribution of a dislocation loop should be considered with respect to processes subsequent to an ion implantation process. Such information is needed for constructing the process simulation apparatus according to the present invention.

That is, according to the series of publications related to a model handling the crystal dislocation loop, the following two issues must be considered when the model is used for a two-dimensional semiconductor process simulation apparatus.

(1) How to define location of a dislocation loop.

(2) To which process the influence or contribution of a dislocation loop regarding diffusion of impurities should be considered with respect to processes subsequent to an ion implantation process.

Additionally, the issue regarding the method for defining location of a dislocation loop mentioned in the above item (1) includes the following two secondary issues.

(a) What assumption can be used when a function representing an average pressure field is calculated based on a function which provides contribution of a single crystal dislocation loop. The average pressure field is generated by dislocation loops distributed in a layer in which the dislocation loop is located.

(b) How to input information regarding location of the dislocation loop to a semiconductor manufacturing process simulation apparatus using a two-dimensional model.

With respect to the above-mentioned issue (a), the published literatures (for example, "H. Park, K. S. Jones and M. E. Law, J., Electrochem. Soc., Vol. 141, 759 (1994)") teach a method for calculating the average pressure field, which is a sum of dislocation loops located in a layer, based on the pressure generated by each dislocation loop. The assumptions used for the calculation are as follows.

- the layer 12 (hereinafter referred to as a dislocation loop layer) in which dislocation loops are formed is a flat plane (refer to FIG. 1)
- the dislocation loops 16 distributed in the dislocation loop layer 12 is perpendicular to the plane representing the layer and they are perpendicular to each other (refer to FIG. 2)
- six (6) most adjacent dislocation loops are taken into consideration (refer to FIG. 3)

Based on the above-mentioned assumptions, the function representing the average pressure field due to the dislocation loops can use a distance from the dislocation loop layer as an argument. Due to the assumption used when the average pressure field is calculated, the dislocation loop layer, in which the dislocation loops are formed, must be a flat plane. However, in a practical manufacturing process of a MOS device, a gate area is used as a mask in the ion implantation process for forming a source area and a drain area. Thus, the dislocation loop layer is not always a flat plane as indicated by a solid line 203 in a two-dimensional cross section shown in FIG. 5.

Accordingly, in order to use the model of the crystal dislocation loop in a semiconductor manufacturing process simulation apparatus using a two-dimensinal model (hereinafter referred to as a two-dimensional semiconductor manufacturing process simulation apparatus), the average pressure field must be defined when the dislocation loop layer is not a flat plane. However, none of the publications teaches such a definition.

Additionally, with respect to the issue mentioned in the item (b), it is considered that the dislocation loop layer is formed in a boundary between an amorphous area and a crystal area formed in a silicon wafer in an ion implantation process. However, there is no publication which suggests a method for representing a configuration of the dislocation loop layer and a method for designating a position of the dislocation loop layer which is convenient for a user of the semiconductor manufacturing process simulation apparatus.

Additionally, the crystal dislocation loops formed in a silicon wafer in an ion implantation process are grown or reduced by a heat treatment subsequent to the ion implantation process, and the dislocation loops finally disappear. The model described in the publications (for example, "H. Park, K. S. Jones and M. E. Law, J. Electrochem. Soc., Vol. 141, 759 (1994)") can represent a process of growth or reduction in a relatively earlier stage of a heat treatment subsequent to an ion implantation process. However, a process of causing the dislocation loops to disappear over a relatively long period is not represented.

Accordingly, if a plurality of heat treatment processes are performed subsequent to an ion implantation process, it is preferable that a user can designate to which heat treatment process the diffusion model considering the influence or contribution of the dislocation loop is used. However, there is no published literature which teaches this concept.

SUMMARY OF THE INVENTION

It is a general object of the present invention to provide an improved and useful semiconductor manufacturing process simulation apparatus in which the above-mentioned problems are eliminated.

A more specific object of the present invention is to provide a semiconductor manufacturing process simulation apparatus using a diffusion model in which a dislocation loop generated in a crystalline substrate during an ion implantation process of a semiconductor manufacturing process is considered with respect to a diffusion in a heat treatment process subsequent to the ion implantation process.

In order to achieve the above-mentioned objects, there is provided according to the present invention a semiconductor manufacturing process simulation apparatus for simulating a manufacturing process of a semiconductor using a substrate, comprising an ion implantation process simulating part which simulates an ion implantation process;

a model generating part which generates a diffusion model in which contribution of dislocation loops is considered, the dislocation loops being formed in the substrate during the ion implantation process; and a heat treatment process simulating part which simulates a heat treatment process subsequent to the ion implantation process, the diffusion model generated by the model generating part being used for simulating diffusion of impurities in the substrate during the heat treatment process, wherein a pressure field generated by the dislocation loops in the substrate is defined in the diffusion model by a function of a distance from a layer in which the dislocation loops are formed.

According to the above-mentioned invention, since the pressure field generated by the dislocation loop is defined by a distance from the layer of the dislocation loops, the average pressure field generated by the dislocation loops can be calculated based on coordinate values of the layer of the dislocation loops even when the layer of the dislocation loops is curved.

In one embodiment according to the present invention, a location of the layer of the dislocation loops may be defined in the diffusion model by a curved line including a line segment and an elliptic arc segment. Thus, coordinate values of the layer of the dislocation loops can be determined by a simple function.

Additionally, the model generating part may calculate a saddle point representing a location of a maximum point of concentration of impurity atoms implanted into the substrate so that a location of the layer of the dislocation loops is defined in the diffusion model by a distance from the maximum point. Thus, coordinate values of the layer of the dislocation loops can be determined by simply inputting information regarding the distance from the maximum point.

Further, the model generating part may calculate a location of a predetermined concentration of impurity atoms implanted into the substrate so that a location of the layer of the dislocation loops is defined in the diffusion model by the location of the predetermined concentration. Thus, coordinate values of the layer of the dislocation loops can be determined by simply inputting information regarding the concentration of the impurity atoms.

The semiconductor manufacturing process simulation apparatus according to the present invention may further comprise an input/output interface including a display unit and an inputting device, the display unit displaying results of simulation performed by the ion implantation process simulating part so that a user inputs information of a location of the layer of the dislocation loops in the diffusion model while the user observes the results of simulation.

In one embodiment according to the present invention, the heat treatment process simulating part may use the diffusion model only for a first heat treatment process after the ion implantation process.

Alternatively, the heat treatment process simulating part may use the diffusion model for a plurality of heat treatment processes subsequent to the ion implantation process, the plurality of heat treatment process including a first heat treatment process subsequent to the ion implantation process.

Additionally, the model generating part may generate a regular diffusion model in which influence of the dislocation loops is not considered so that a selected one of the diffusion model and the regular diffusion model is supplied to the heat treatment process simulating part.

Additionally, the semiconductor manufacturing process simulation apparatus according to the present invention may further comprise an input/output interface which interfaces between the semiconductor manufacturing process simulation apparatus and a user, wherein the model generating part comprises:

at least two of a first model generating part, a second model generating part, a third model generating part and a fourth model generating part; and a switching part which switches an output of the model generating part to one of outputs from the first to fourth model generating parts, wherein the first model generating part generates the diffusion model by defining a location of the layer of the dislocation loops by a curved line including a line segment and an elliptic arc segment;

the second model generating part calculates a saddle point representing a location of a maximum point of concentration of impurity atoms implanted into the substrate so as to generate the diffusion model in which a location of the layer of the dislocation loops is defined by a distance from the maximum point;

the third model generating part calculates a location of a predetermined concentration of impurity atoms implanted into the substrate so as to generate the diffusion model in which a location of the layer of the dislocation loops is defined by the location of the predetermined concentration; and a fourth model generating part which generates the diffusion model in which a location of the layer of the dislocation loops is input by the user while the user observes results of simulation performed by the ion implantation process simulating part via the input/output interface.

According to this invention, a user can select a method for inputting location information regarding the layer of the dislocation loops which method is appropriate for the semiconductor manufacturing process to be simulated.

In one embodiment according to the present invention, the heat treatment process simulating part may use the diffusion model only for a first heat treatment process after the ion implantation process. Thus, if a heat treatment process after the first heat treatment process subsequent to the ion plantation process is not influenced by the dislocation loops or influence of the dislocation loops is not necessarily considered, a regular diffusion model which does not consider influence of the dislocation loops can be used.

Alternatively, the heat treatment process simulating part may use the diffusion model for a plurality of heat treatment processes subsequent to the ion implantation process, the plurality of heat treatment processes including a first heat treatment process subsequent to the ion implantation process. Thus, if a heat treatment process after the first heat treatment process subsequent to the ion plantation process is influenced by the dislocation loops or influence of the dislocation loops is necessarily considered, the diffusion model which considers influence of the dislocation loops can be used.

Additionally, the model generating part may generate a regular diffusion model in which influence of the dislocation loop is not considered so that a selected one of the diffusion model and the regular diffusion model is supplied to the heat treatment process simulating part.

Additionally, the semiconductor manufacturing process simulation apparatus according to the present invention may further comprise an image data inputting part which inputs image data to be used by the model generating part, the image data being produced by reading a photographic image of the substrate containing the dislocation loops, the photographic image being taken by a transmission electron microscope. Thus, information regarding the dislocation loops can be automatically input to the simulation apparatus without a manual inputting operation of a user.

In one embodiment according to the present invention, the image data inputting part may comprise an image scanner which reads the photographic image.

Alternatively, the image data inputting part may comprise a digital data reading unit which reads the image data recorded on a recording medium.

Alternatively, the image data inputting part may comprise an interface which interfaces the semiconductor manufacturing process simulation apparatus with an external device so that the image data is transmitted from the external device.

Additionally, the image data inputting part may determine whether the image data corresponds to a plan view of the substrate or a cross-sectional view of the substrate so that different information regarding the dislocation loops is extracted from the image data.

The semiconductor manufacturing process simulation apparatus according to the present invention may further comprise a database part which stores the information regarding the dislocation loops so that the information is arranged in accordance with process conditions of the manufacturing process.

Additionally, the semiconductor manufacturing process simulation apparatus according to the present invention may further comprise a process condition contribution calculating part which calculates a contribution factor regarding the dislocation loop based on the information stored in the database part, the contribution factor being used for generating the diffusion model.

Additionally, there is provided according to another aspect of the present invention a computer specially configured by executing program code stored on a computer usable media for simulating a manufacturing process of a semiconductor using a substrate, the program code including:
  computer-readable program code means for simulating an ion implantation process;
  computer-readable program code means for generating a diffusion model in which contribution of a dislocation loop is considered, the dislocation loop being formed in the substrate during the ion implantation process;
  computer-readable program code means for defining a pressure field generated by the dislocation loop in the substrate by a function of a distance from the dislocation loop; and
  computer-readable program code means for simulating a heat treatment process subsequent to the ion implantation process, the diffusion model being used for simulating diffusion of impurities in the substrate in the heat treatment process.

Further, there is provided according to another aspect of the present invention a processor readable medium storing program code for causing a computer to simulate a manufacturing process of a semiconductor using a substrate, comprising:
  first program code means for simulating an ion implantation process;
  second program code means for generating a diffusion model in which contribution of a dislocation loop is considered, the dislocation loop being formed in the substrate during the ion implantation process;
  third program code means for defining a pressure field generated by the dislocation loop in the substrate by a function of a distance from the dislocation loop; and
  fourth program code means for simulating a heat treatment process subsequent to the ion implantation process, the diffusion model being used for simulating diffusion of impurities in the substrate in the heat treatment process.

Other objects, features and advantages of the present invention will become more apparent from the following detailed description when read in conjunction with the accompanying drawings.

BRIEF DESCRIPTION OF THE DRAWINGS

FIG. 1 is an illustration of a cross section of a substrate for indicating a flat plane in which crystal dislocation loops are formed;

FIG. 2 is an illustration of crystal dislocation loops being perpendicular to each other;

DETAILED DESCRIPTION OF THE PREFERRED EMBODIMENTS

A description will now be give, with reference to the drawings, of first to twelfth embodiments according to the present invention.

First Embodiment

Figure 4:
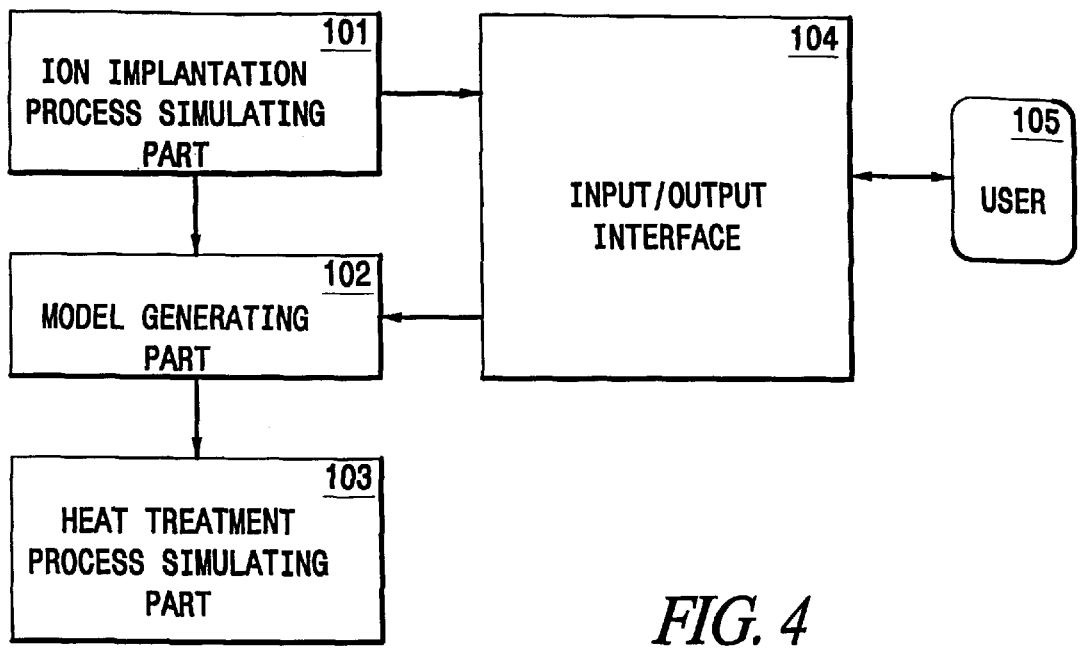
FIG. 4 is a block diagram of a structure of a semiconductor manufacturing process simulation apparatus according to a first embodiment of the present invention.

FIG. 4 is a block diagram of a structure of a semiconductor manufacturing process simulation apparatus according to the first embodiment of the present invention. In FIG. 4, the semiconductor manufacturing process simulation apparatus according to the present invention comprises an ion implantation process simulating part 101, a model generating part 102 and a heat treatment process simulating part 103. The ion implantation process simulating part 101 simulates an ion implantation process performed in a semiconductor manufacturing process. The model generating part 102 generates a diffusion model which considers influence or contribution of dislocation loops formed in a silicon substrate during the ion implantation process. The heat treatment process simulating part 103 simulates diffusion of impurities in a heat treatment process subsequent to the ion implantation process by using the diffusion model generated by the model generating part 102. The semiconductor manufacturing process simulation apparatus according to the present embodiment calculates a pressure field generated by the dislocation loop to be defined in the silicon wafer used for the diffusion model. The pressure field is defined by a function of a distance from the dislocation loops as an argument.

In the present invention, a pressure field generated by dislocation loops can be calculated by providing a coordinate of a position of a layer in which the dislocation loops are formed since the pressure field generated by the dislocation loops is defined by a function of a distance from the dislocation loops, whereas the conventional technique handles only a case in which the layer of the dislocation loops is a flat plane.

Figure 5:
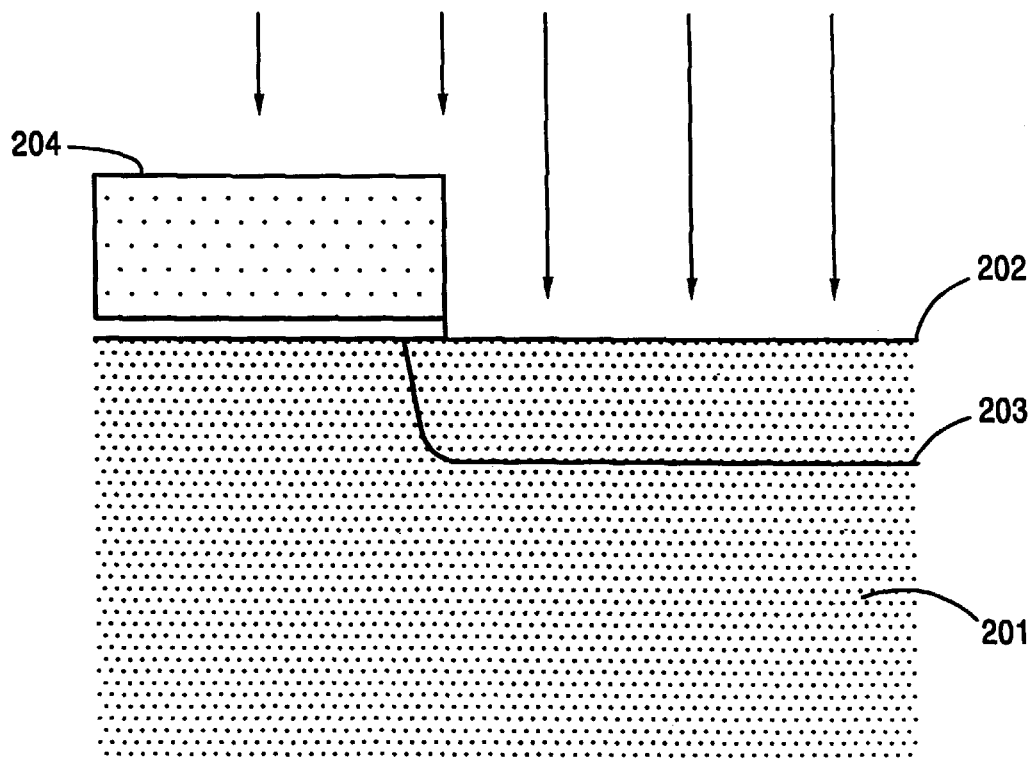
FIG. 5 is an illustration for explaining a crystal dislocation loop which is formed when an ion implantation process is performed.

In the practical ion implantation process performed when a source area and a drain area are formed, a gate area 204 is used as a mask as shown in FIG. 5. Ions are implanted through a surface of the silicon wafer 201 through a surface 202. Thus, the dislocation loops generated in the crystalline structure do not lie in a flat plane but lie in a curved plane 203 as shown in FIG. 5. According to the present embodiment, influence or contribution of the dislocation loops can be taken into consideration even in such a case where the dislocation loops lie in a curved plane.

A detailed description will now be given of the definition of the pressure field using a function of a distance from a position of dislocation loops according to the present invention.

Figure 3:
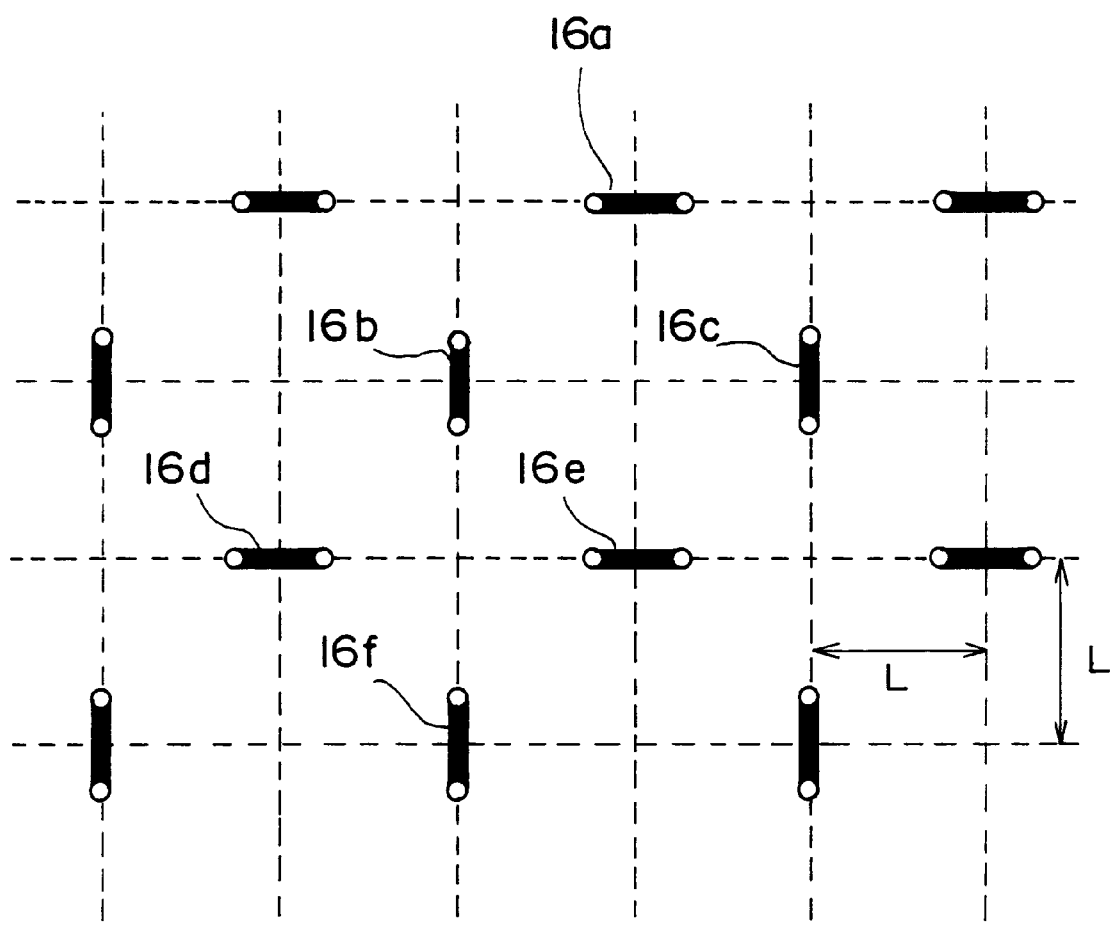
FIG. 3 is an illustration for explaining a sum of contributions of six adjacent dislocation loops.

In the conventional technique, it is assumed that all dislocation loops lie in a single flat plane and are perpendicular to the plane to each other. Additionally, influence or contribution of six adjacent dislocation loops 16a to 16f to an average pressure field is taken into consideration as shown in FIG. 3. Thus, the layer (hereinafter referred to as a dislocation loop layer) in which the dislocation loops are formed must be defined as a flat plane 12 shown in FIG. 1 despite the fact that the average pressure field is defined by a function of a distance from the dislocation loop layer.

However, when the relationship between crystal surfaces where the dislocation loops are formed in the practical ion implantation process was taken into consideration, it was found that the assumption used for calculating the above-mentioned average pressure field is not sufficient. That is, it was found that the assumption was made for obtaining an approximate average of pressure generated by the dislocation loops for the sake of convenience. On the other hand, in the present invention, the dislocation loop layer can be any type of plane other than a flat plane even the function the same as that used in the conventional technique is used for representing the average pressure field generated by the dislocation loops.

A more detailed description will now be given below of the assumption used for obtaining the average pressure field and a relationship between the crystal surfaces. For the sake of simplification of the description, it is assumed that an ion implantation is performed through the surface 14 to the silicon wafer 10 shown in FIG. 1.

In a manufacturing process for a typical MOS semiconductor device, a (100) oriented silicon wafer is used. Accordingly, if it is assumed that the dislocation loop layer is parallel to the surface of the silicon wafer, the dislocation loop layer is formed in the (100) plane. However, it is considered that dislocation loops are formed in the (110) plane or the (111) plane due to their property. This is inconsistent with the assumption used when the average pressure field is obtained that the dislocation loops distributed in the layer are perpendicular to the flat plane in which the dislocation loop layer is formed.

Additionally, the (110) plane and the (111) plane are oblique to the surface of the silicon wafer when the surface of the wafer corresponds to the (100) plane. Thus, it is extremely complex and difficult to calculate an accurate average pressure field generated by the dislocation loops located in the (110) and (111) surfaces.

Therefore, it is appreciated that the assumption used for calculating the average pressure field is an assumption which calculates an approximate average of the pressure generated by the dislocation loops for the sake of convenience.

For the above-mentioned reason, the present invention uses, as an approximation, the function the same as that of the conventional technique so as to calculate the average pressure field generated by the dislocation loops. Additionally, it is assumed that the dislocation loop layer is not limited to a flat plane. Thus, the average pressure field can be calculated when the coordinate of the dislocation loop layer is provided.

A description will now be given of a calculation of an average pressure field generated by dislocation loops. The pressure generated by a single dislocation loop can be calculated by using the following equation (1) which is described in the literature, L. Borucki, in "Workshop on Numerical Modeling of Processes and Devices for Integrated Circuits": NUPAD IV, Seattle, Wash., May 31, (1992).

$$p = \left(\frac{b\mu}{R\gamma}\right)\left(\frac{1}{\pi\sqrt{(\rho+1)^2+\zeta^2}}\right)\left[\left(\frac{1-\rho^2-\zeta}{(1-\rho)^2+\zeta^2}\right)E(\alpha)+K(\alpha)\right] \quad (1)$$

where
$\rho = r/R$
$\zeta = z/R$
$\alpha = (4\rho/((\rho+1)^2+\zeta^2))^{1/2}$
$\gamma = 3(1-\upsilon)/(1+\upsilon)$ Additionally, $E(\alpha)$ and $K(\alpha)$ are a first kind complete elliptic integral and a second kind complete elliptic integral, respectively. The factor $\mu$ is modulus of rigidity. The factor is Poisson's ratio.

An average pressure field can be calculated by using the above-mentioned equation (1) which calculates a pressure field generated by a single dislocation and using the assumption described below:

the dislocation loop layer is a flat plane (refer to FIG. 1);
the dislocation loops distributed in the dislocation loop layer are perpendicular to the plane representing the layer, and the dislocation loops are perpendicular to each other (refer to FIG. 2); and
six most adjacent dislocation loops are taken into consideration (refer to FIG. 3).

The equation for calculating the average pressure field is as follows.

$$\langle p \rangle = \frac{1}{L^2}\int_0^L\int_0^L P_{loop(i)}\, dx\, dy \quad (2)$$

According to the averaging operation by the equation (2), the average pressure $\langle p \rangle$ can be represented by a function of the radius R of the dislocation loop and a distance z from the plane in which the dislocation loops are formed. Distribution of pressure in the plane is averaged.

$$\langle p \rangle = f(R,z) \quad (3)$$

According to the conventional technique, since the function (3) is applied only when the plane in which the dislocation loops lie is a flat plane, the calculation can be applied only for a case where there is no mask area such as the gate area in the ion implantation process as shown in FIG. 1. On the other hand, according to the present invention, the plane in which the dislocation loops are formed is applied to curved planes such as the plane 203 shown in FIG. 5 other than a flat plane. Thus, the average pressure field $\langle p \rangle$ can be calculated by designating the radius R of the dislocation loop and the distance z from the plane in which the dislocation loops are formed.

Second Embodiment

In a semiconductor manufacturing process according to the second embodiment of the present invention, a position of the dislocation loops in a diffusion model is defined by a curved line consisting of line segments and elliptic arc segments. It should be noted that the structure of the semiconductor manufacturing process simulation apparatus according to the present embodiment is the same as that shown in FIG. 4.

Figure 6:
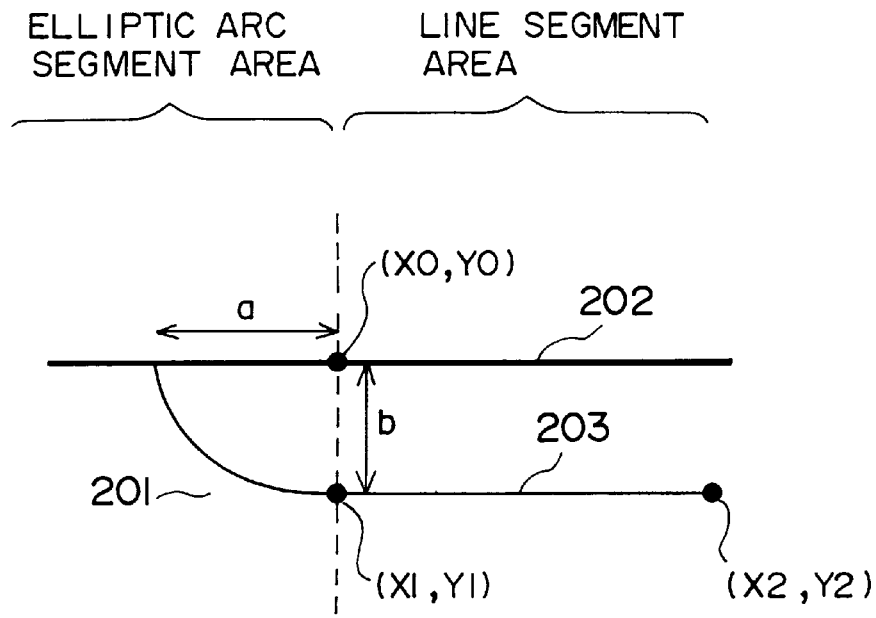
FIG. 6 is an illustration for explaining a method for defining location of a dislocation loop layer.

A description will be described below, with reference to FIG. 6, of a method for designating the position of the dislocation loop layer by the curved line consisting of line segments and elliptic arc segments. The layer 203 shown in FIG. 6 consists of a line segment and an elliptic arc segment. The elliptic arc segment shown in FIG. 6 can be represented by the following equation (4).

$$(x-x0)^2/a^2+(y-y0)^2/b^2=1 \quad (4)$$

where (x0, y0) is the coordinate of the center of the ellipse; and a and b are the greater diameter and the smaller diameter of the ellipse, respectively. Additionally, the line segment can be represented by designating the coordinate (x1, y1) of the start point and the coordinate (x2, y2) of the end point.

As mentioned above, the elliptical arc segment can be represented by designating the center point and the greater and smaller diameters of the ellipse, and line segment can be represented by designating the start and end points. It should be noted that if there are a plurality of line segments and elliptic arc segments, the designation may be made for each of the segments.

Third Embodiment

In a semiconductor manufacturing process simulation apparatus according to a third embodiment of the present invention, saddle points representing maximum values of the implanted impurity atoms are calculated based on the results of calculation of the ion implantation simulating part 101 shown in FIG. 4 so that the position of the dislocation loop in a diffusion model is defined by an arbitrary distance d from the saddle point. It should be noted that the structure of the semiconductor manufacturing process simulation apparatus according to the present embodiment is the same as that shown in FIG. 4.

Figure 7:
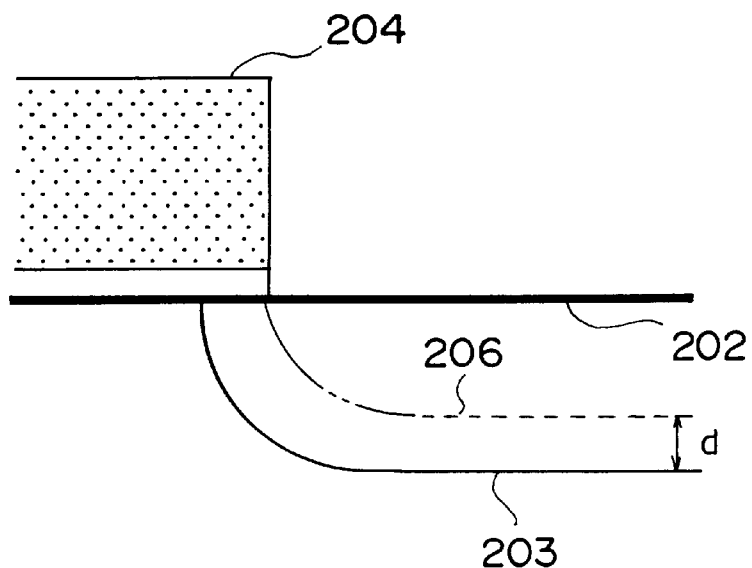
FIG. 7 is an illustration for explaining a method for defining location of a dislocation loop layer according to a third embodiment of the present invention.
Figure 8:
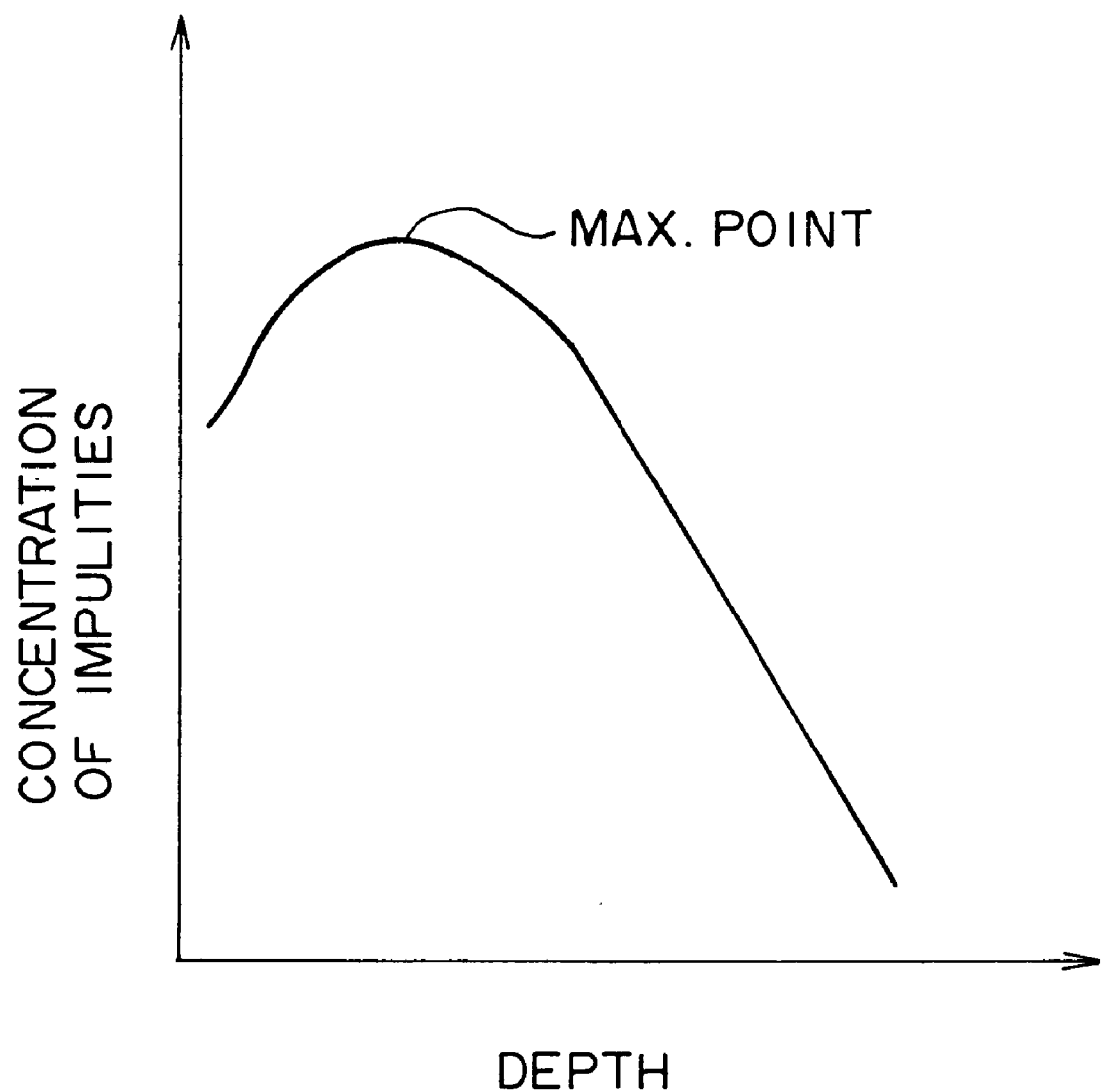
FIG. 8 is a graph showing a maximum point of concentration of impurities, the maximum point forming a saddle point.

More specifically, as shown in FIG. 7, the position of the dislocation loop layer 203 is defined by the distance d from the saddle point 206, wherein the distance d can be set to an arbitrary distance. The saddle point 206 is obtained by connecting the maximum value points of concentration of the impurity atoms as shown in FIG. 8.

Fourth Embodiment

In a semiconductor manufacturing process simulation apparatus according to a fourth embodiment of the present invention, the position of the dislocation loops in the diffusion model is defined by a position of an arbitrary concentration of the implanted impurity atoms. The concentration of the impurity atoms is calculated by the ion implantation process simulating part 101 shown in FIG. 4. It should be noted that the structure of the semiconductor manufacturing process simulation apparatus according to the present embodiment is the same as that shown in FIG. 4. The concentration to be used can be designated by a user through the input/output interface 104 such as a keyboard and a display device.

Figure 9:
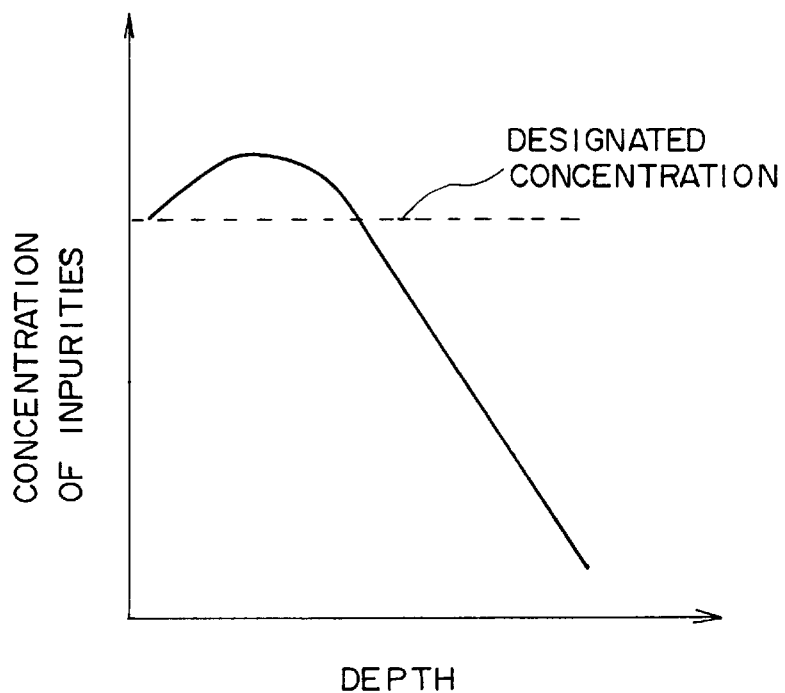
FIG. 9 is a graph showing a designated concentration of impurities which is used in a fourth embodiment according to the present invention.
Figure 10:
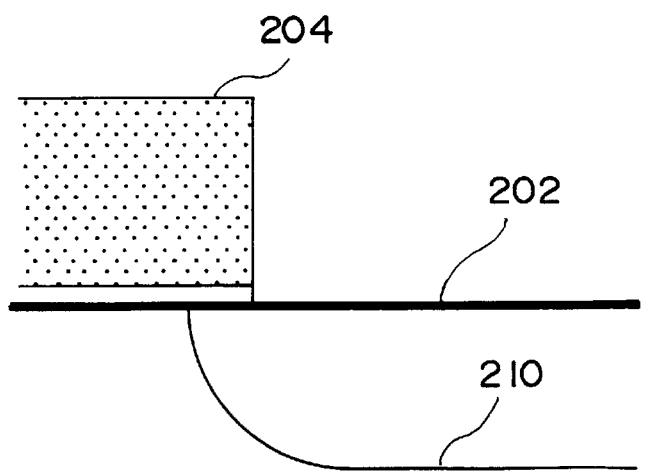
FIG. 10 is an illustration showing location of a dislocation loop layer determined by the designation of concentration.
Figure 11:
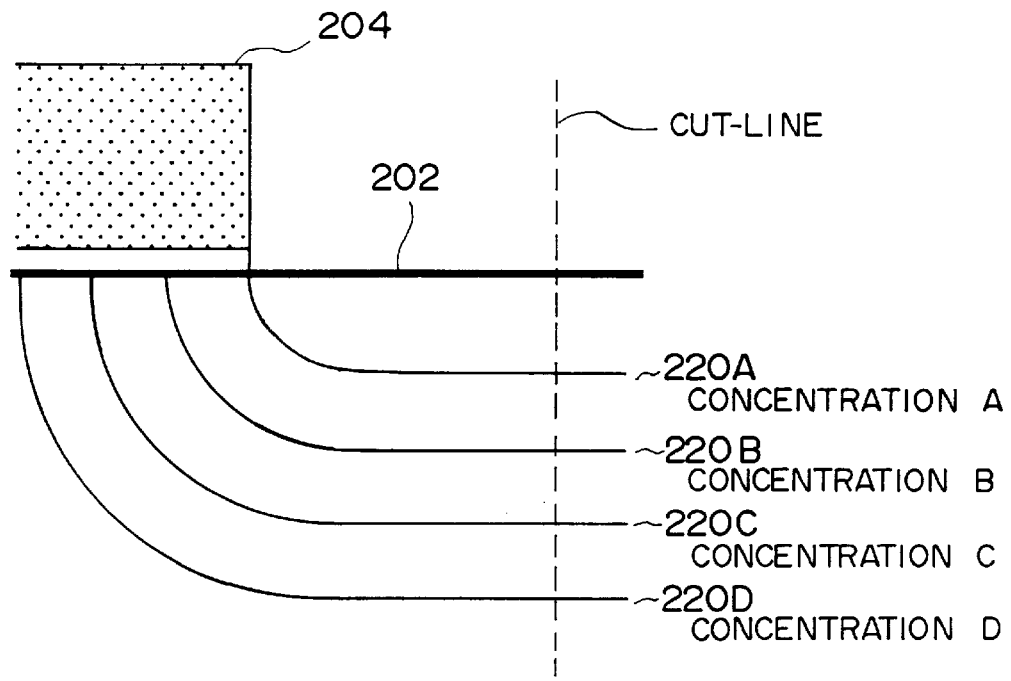
FIG. 11 is an illustration of a two-dimensional contour line map prepared in a fifth embodiment according to the present invention.
Figure 12:
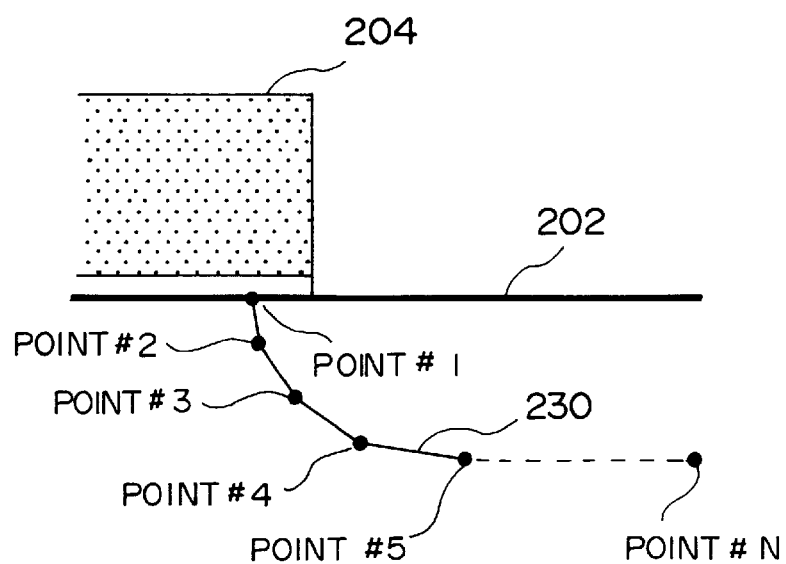
FIG. 12 is an illustration for explaining an inputting operation of impurity concentration profile according to the fifth embodiment of the present invention.

More specifically, the user designates an arbitrary concentration of the impurity atoms in the concentration distribution of the impurity atoms which is a result of the operation of the ion implantation process simulating part 101 as shown in FIG. 9. By connecting each point corresponding to the designated concentration, a curved line 210 as shown in FIG. 10 is obtained. The line 210 is defined as the position of the dislocation loop layer.

Fifth Embodiment

In a semiconductor manufacturing process according to a fifth embodiment of the present invention, a result of operation of the ion implantation process simulating part 101 is displayed through the input/output interface 104 sc that a user can input coordinate values of a position of the dislocation loop layer while observing the displayed information. The dislocation loop layer is defined at the position input by the user.

The input/output interface 104 has a function to display the distribution of impurities calculated by the ion implantation process simulating part 101. The distribution of impurities is; displayed by a two-dimensional contour line map. The input/output interface 104 also has a function to display a concentration profile corresponding to the concentration input by the user.

The user determines the position of the dislocation loop layer to be used by observing the result of operation of the ion implantation process simulating part 101. That is, the position of the dislocation loop layer is input to the semiconductor manufacturing process simulation apparatus by inputting coordinate values. That is, a coordinate value of each point #1 to #N is input by a numerical input method through a keyboard, or is input by a positional designation through a pointing device such as a mouse. In the semiconductor manufacturing process simulation apparatus according to the present embodiment, a space between adjacent points is set as a line segment so as to define the dislocation loop layer 230.

Sixth Embodiment

Figure 13:
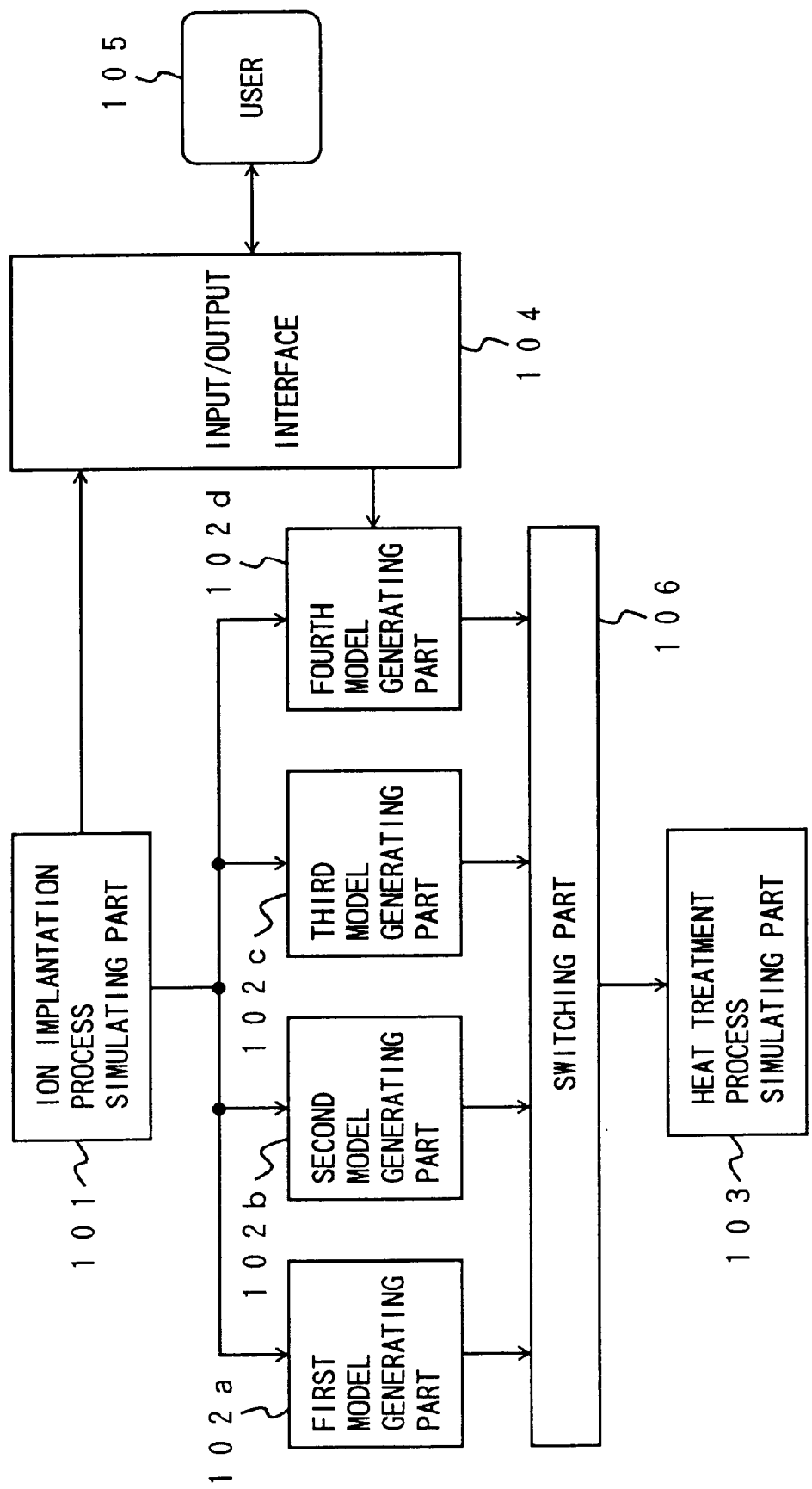
FIG. 13 is a block diagram of a semiconductor manufacturing process simulation apparatus according to a sixth embodiment of the present invention.

FIG. 13 is a block diagram of a semiconductor manufacturing process simulation apparatus according to a sixth embodiment of the present invention. In FIG. 13, parts that are the same as the parts shown in FIG. 4 are given the same reference numerals, and descriptions thereof will be omitted.

The semiconductor manufacturing process according to the present embodiment is provided with, instead of the model generating part 102 of the first embodiment, a first model generating part 102*a*, a second model generating part 102*b*, a third model generating part 102*c*, a forth model generating part 102*d* and a switching part 106 which selects one of outputs of the first to fourth model generating parts 102*a* to 102*d*.

The first model generating part 102*a* defines the dislocation loop layer by a curved line consisting of line segments and elliptical arc segments. The second model generating part 102*b* defines the dislocation loop layer by calculating a saddle point representing a maximum value of the implanted impurity atoms based on the results of calculation of the ion implantation simulating part 101 so that the position of the dislocation loop layer in a diffusion model is defined by an arbitrary distance d from the saddle point. The third model generating part 102*c* defines the dislocation loop layer by a position of an arbitrary concentration of the implanted impurity atoms, the concentration of the impurity atoms being calculated by the ion implantation process simulating part 101 so that the concentration to be used can be designated by a user through the input/output interface 104. The fourth model generating part 102*d* defines the dislocation loop layer by the position designated by coordinate values of a position of the dislocation loop layer input by a user through the input/output interface device while observing the result of calculation of the ion implantation process simulating part 101.

The switching part 106 selects one of the first to fourth model generating parts 102*a* to 102*d* to obtain an appropriate diffusion model in accordance with an instruction input by the user. Thus, the user can select the most appropriate diffusion model in accordance with information possessed by the user such as a result of previous simulation or actual measurement of the location of the dislocation loops.

Seventh Embodiment

Figure 14:
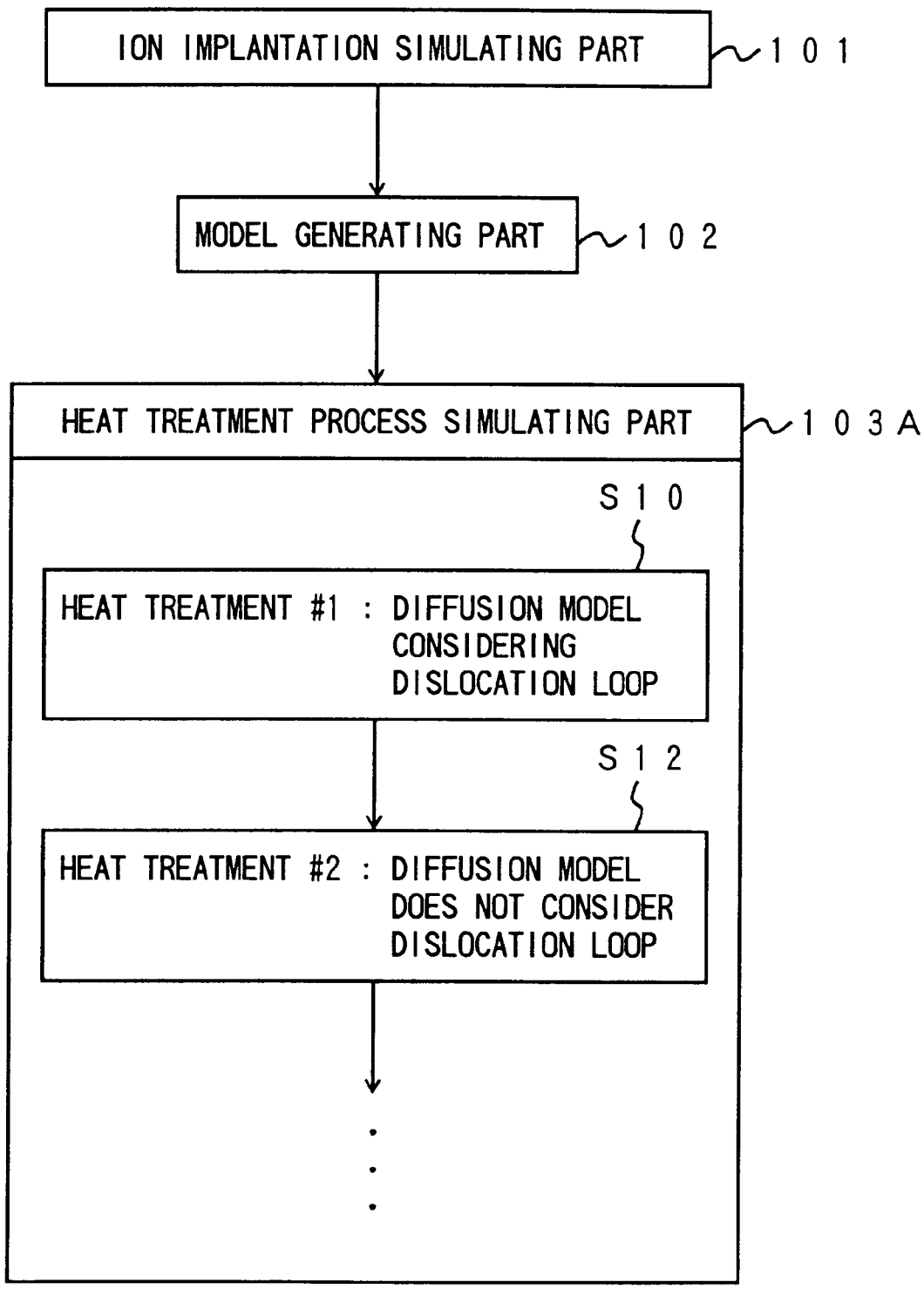
FIG. 14 is a block diagram of a semiconductor manufacturing process simulation apparatus according to a seventh embodiment of the present invention.

FIG. 14 is a block diagram of a semiconductor manufacturing process simulation apparatus according to a seventh embodiment of the present invention. The semiconductor manufacturing process simulation apparatus shown in FIG. 14 is provided with a heat treatment process simulating part 103A instead of the heat treatment process simulating part 103 shown in FIG. 4. It should be noted that a part of a flowchart of a process performed by the heat, treatment process simulating part 103A is shown in FIG. 14.

In the heat treatment process simulating part 103A of the present embodiment, a diffusion model considering the influence or contribution of the dislocation loop is used only for the first heat treatment process performed after an ion implantation process. The first heat treatment process is performed in step S10. However, a regular diffusion model is used for the second or later heat treatment process which is performed in step S12. It should be noted that the input of the location of the dislocation loop layer is performed in a manner similar to that of the sixth embodiment.

The semiconductor manufacturing process simulation apparatus according to the present embodiment enables use of the regular diffusion model for the second or later heat treatment process when influence or contribution of the dislocation loop in the second or later heat treatment process is little or when the diffusion model considering the dislocation loop is not appropriate for the second or later heat treatment process. For example, when the first heat treatment process after an ion implantation process lasts for a long time, the dislocation loops generated by the ion implantation process may be removed during the first heat treatment process. In such a case, the semiconductor manufacturing process simulation apparatus according to the present embodiment is particularly effective since the diffusion model considering the dislocation loops is no longer needed.

Eighth Embodiment

Figure 15:
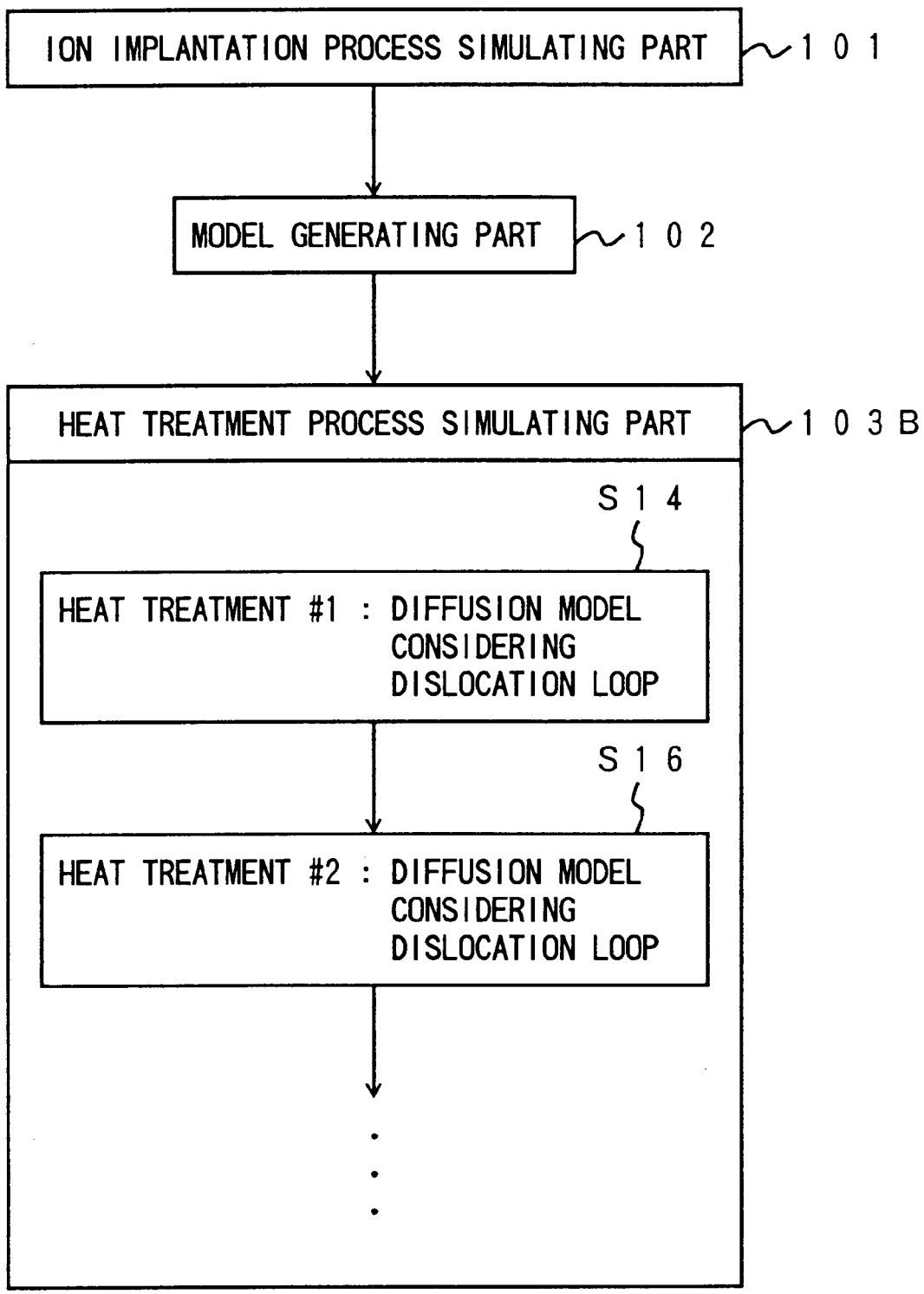
FIG. 15 is a block diagram of a semiconductor manufacturing process simulation apparatus according to an eighth embodiment of the present invention.

FIG. 15 is a block diagram of a semiconductor manufacturing process simulation apparatus according to an eighth embodiment of the present invention. The semiconductor manufacturing process simulation apparatus shown in FIG. 15 is provided with a heat treatment process simulating part 103B instead of the heat treatment process simulating part 103 shown in FIG. 4. It should be noted that a part of a flowchart of a process performed by the heat treatment process simulating part 103B is shown in FIG. 15.

In the heat treatment process simulating part 103B of the present embodiment, a diffusion model considering the influence or contribution of the dislocation loop is used for the first heat treatment process performed after an ion implantation process. The first heat treatment process is performed in step S14. Similarly, a diffusion model considering the influence or contribution of the dislocation loop is used for the second or later heat treatment process which is performed in step S16. It should be noted that the input of the location of the dislocation loop layer is performed in a manner similar to that of the sixth embodiment.

The semiconductor manufacturing process simulation apparatus according to the present embodiment is particularly effective when the first heat treatment process and the second and later heat treatment processes are performed at a temperature applicable to the temperature at which the dislocation loop can be applicable and the process time is relatively short as the model is applicable to the dislocation loop.

Ninth Embodiment

Figure 16:
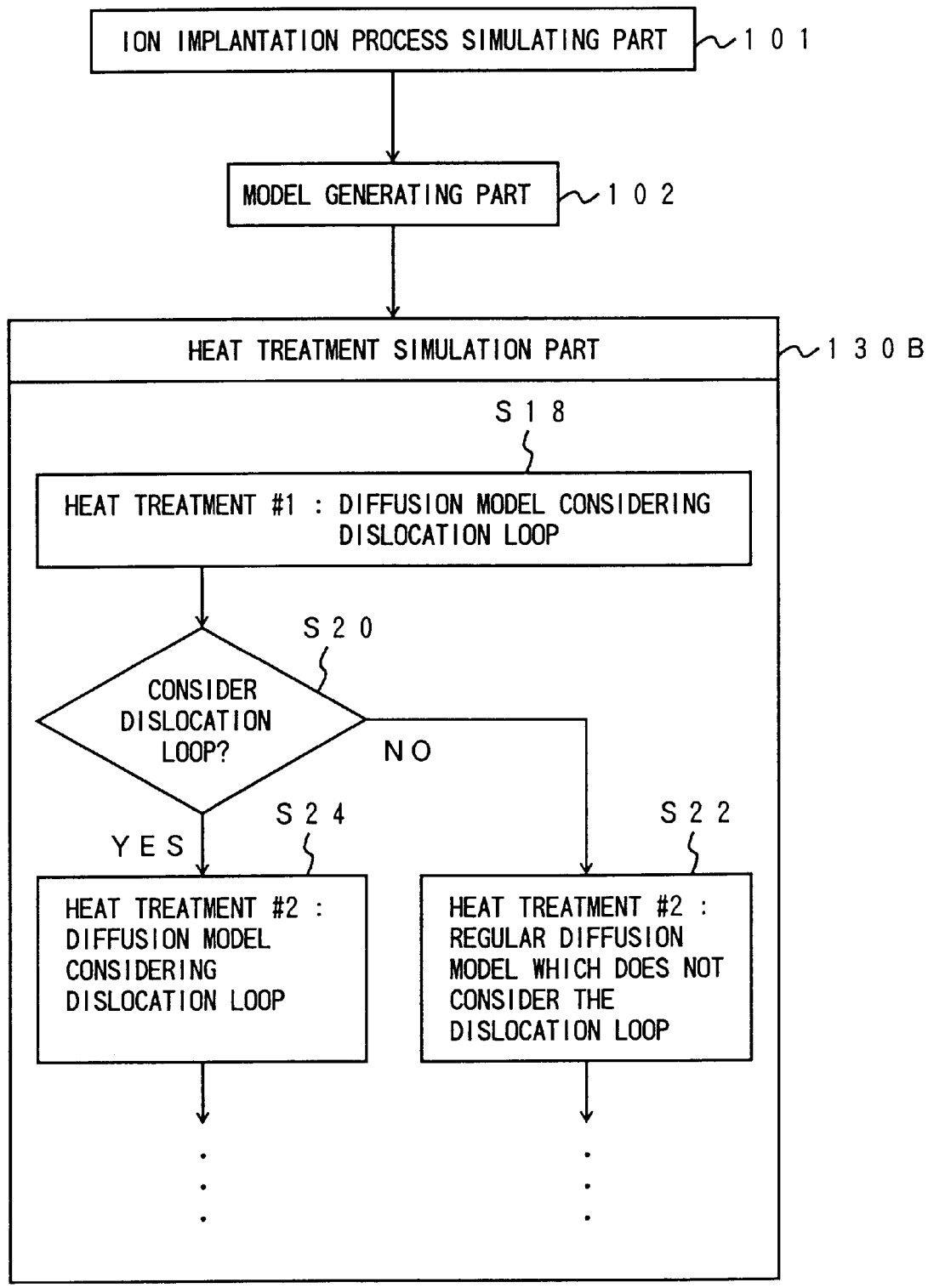
FIG. 16 is a block diagram of a semiconductor manufacturing process simulation apparatus according to a ninth embodiment of the present invention.

FIG. 16 is a block diagram of a semiconductor manufacturing process simulation apparatus according to a ninth embodiment of the present invention.

In this embodiment, a diffusion model considering influence or contribution of the dislocation loop is used for the first heat treatment process performed after an ion implantation process. For the second or later heat treatment process subsequent to the first heat treatment process, one of a diffusion model which considers contribution of dislocation loops and a diffusion model which does not consider contribution of dislocation loops is selected. It should be noted that the input of the location of the dislocation loop layer is performed in a manner similar to that of the sixth embodiment.

That is, in the heat treatment simulation part 130B, the first heat treatment process is performed, in step S18, by using a diffusion model which considers influence or contribution of the dislocation loop. Then, if it is determined, in step S20, that there is no need to consider influence or contribution of the dislocation loop, the routine proceeds to step S22 in which the second or later heat treatment process uses a diffusion model which does not consider the influence or contribution of the dislocation loop. On the other hand, if it is determined, in step S20, that influence or contribution of the dislocation loop should be considered for the second or later heat treatment process, the routine proceeds to step S24 in which the second or later heat treatment process uses a diffusion model which considers influence or contribution of the dislocation loop.

According to the present embodiment, a user can select one of the diffusion models for the second or later heat treatment process. One of the diffusion models considers influence or contribution of the dislocation loop and the other does not. Thus, the user can select an appropriate diffusion model to deal with various conditions of the semiconductor manufacturing process.

In the above-mentioned embodiments, information regarding the dislocation loop is manually input by a user through the input/output interface. Generally, the information regarding the dislocation loop includes density of the dislocation loops, location of the dislocation loop layer and a configuration of each of the dislocation loops. The information regarding the dislocation loops is usually obtained by a transmission electron microscope (TEM). Therefore, the user must obtain information regarding the dislocation loops before the semiconductor manufacturing process simulation is performed by the simulation apparatus according to the above-mentioned embodiments. Since analysis of the TEM data requires a long time and labor, it is desired that the simulation apparatus has a function to automatically generates data necessary for executing the simulation from the photographic image obtained by the TEM.

Figure 17:
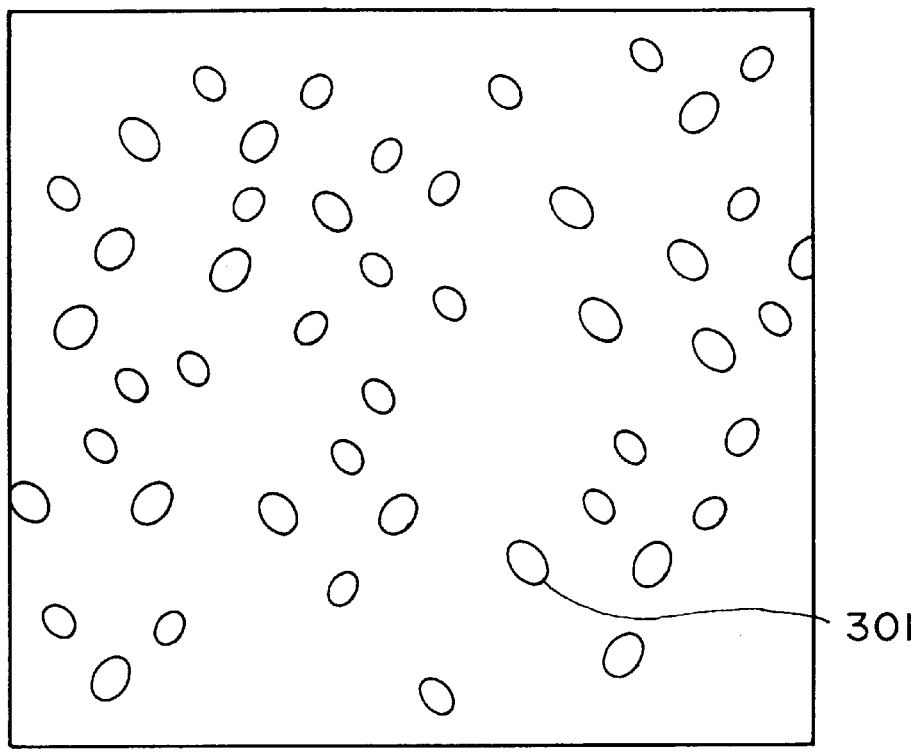
FIG. 17 is an illustration showing a plan view photographic image taken by a TEM.

More specifically, the diffusion model which considers influence or contribution of the dislocation loops uses information regarding a physical amount of the dislocation loops. The physical amount of the dislocation loops suggested in the prior art includes density of the dislocation loops, a size of each dislocation loop and a location of the dislocation loops in the silicon wafer. The physical amount of the dislocation loops is generally obtained from a photographic image taken by a transmission electron microscope (TEM). Location of the dislocation loops can be obtained from a cross-sectional photographic image taken by the TEM. The cross-sectional photographic image is similar to the illustration shown in FIG. 5. Density and size of the dislocation loops can be obtained from a plan view photographic image taken by the TEM. The plan view photographic image is similar to the illustration shown in FIG. 17. In FIG. 17, each circle indicated by reference numeral 301 corresponds to a single dislocation loop.

The diffusion model which considers the influence or contribution of the dislocation loop is prepared for accurately representing physical phenomena in the silicon wafer during a diffusion process so as to improve accuracy of simulation. Thus, the physical amount of the dislocation loop is preferably represented by data obtained from actual measurement. However, there may be a case where the amount of data is not sufficient for a simulation. In such a case, appropriate values may be set to a parameter representing the physical amount which is insufficient for the simulation so as to execute the simulation.

As mentioned above, in the diffusion model which considers influence or contribution of the dislocation loops, the data representing the physical amount of the dislocation loop is preferably obtained from actual measurement, but, a parameter may be used for the insufficient data.

Accordingly, it is desired that the simulation apparatus be provided with a data inputting and analyzing part which automatically obtains parameter information regarding the dislocation loops. The embodiments described below are directed to a semiconductor manufacturing process simulation apparatus provided with such a function to automatically obtain information regarding the dislocation loop.

Figure 18:
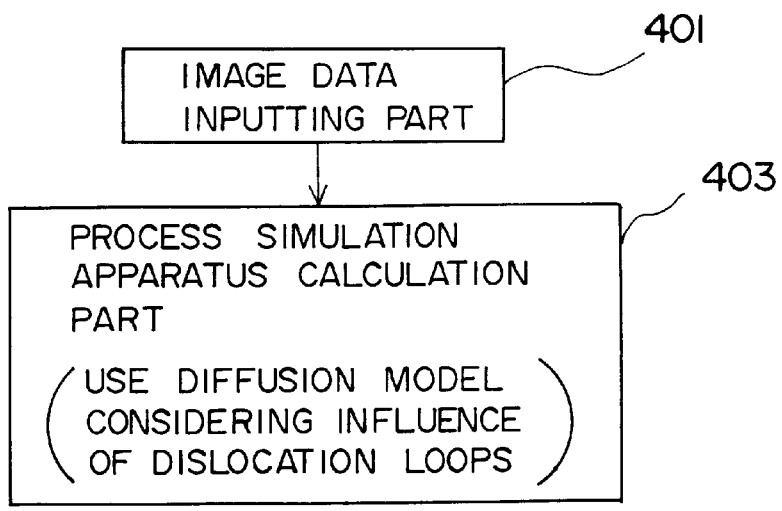
FIG. 18 is a block diagram of a semiconductor manufacturing process simulation apparatus which enables an automatic input of data representing the physical amount of the dislocation loop.

FIG. 18 is a block diagram of a semiconductor manufacturing process simulation apparatus which enables an automatic input of data representing the physical amount of the dislocation loop. In FIG. 18, an image data inputting part 401 reads an image of a silicon wafer having the dislocation loops so as to generate image data. The image data inputting part 401 obtains information representing density, size and location of the dislocation loops from the image data, and supplies the information to a process simulation apparatus calculation part 403. The process simulation apparatus calculation part 403 corresponds to the ion implantation process simulating part 101, the model generating part 102 and the heat treatment process simulating part 103 shown in FIG. 4. Thus, influence or contribution of the dislocation loops can be taken into consideration based on the information regarding the dislocation loops supplied by the image data inputting part 401.

Tenth Embodiment

Figure 19:
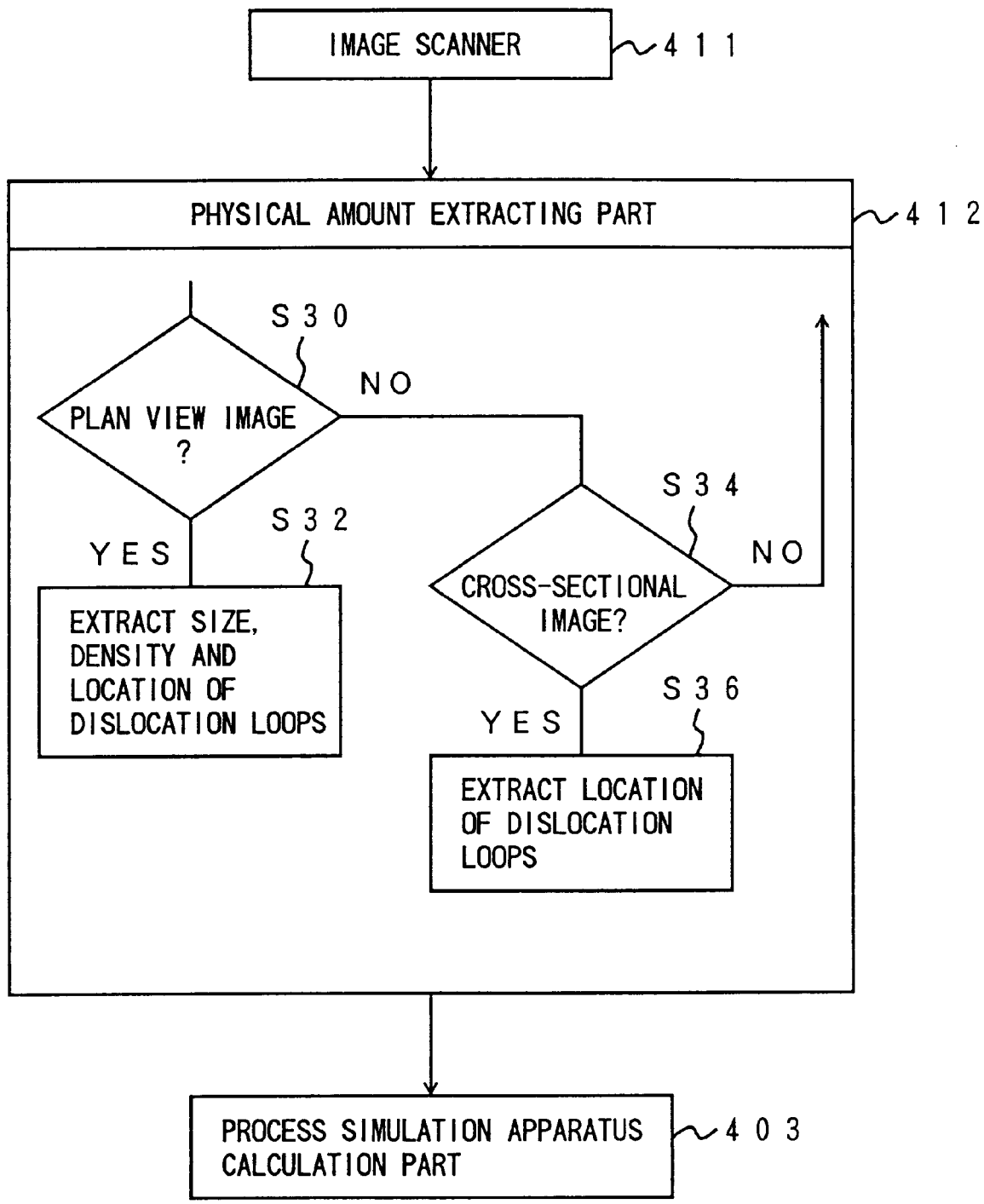
FIG. 19 is a block diagram of a semiconductor manufacturing process simulation apparatus according to a tenth embodiment according to the present invention.

FIG. 19 is a block diagram of a semiconductor manufacturing process simulation apparatus according to a tenth embodiment according to the present invention.

The semiconductor manufacturing process simulation apparatus according to the present embodiment comprises an image scanner 411, a physical amount extracting part 412 and a process simulation apparatus calculation part 403. The process simulation apparatus calculation part 403 corresponds to the ion implantation process simulating part 101, the model generating part 102 and heat treatment process simulating part 103 shown in FIG. 4.

Before the simulation is started by the semiconductor manufacturing process simulation apparatus, a photographic image of the dislocation loops is taken by a transmission electron microscope (TEM). Then, the photographic image of the dislocation loop is scanned by the image scanner 411 to obtain image data regarding the dislocation loops in a silicon wafer. The image data is supplied to a physical amount extracting part 412. In the physical amount extracting part 412, it is determined, in step S30, whether or not the image data supplied by the image scanner 411 corresponds to a plan view image of the silicon wafer. If it is determined that the image data corresponds to the plan view image, size, density and location information of the dislocation loops is extracted from the image data in step S32. On the other hand, if it is determined, in step S30, that the image data does not correspond to a plan view image, it is determined, in step S34, whether or not the image data corresponds to a cross-sectional image of the silicon wafer. If it is determined that the image data corresponds to a cross-sectional image, location information of the dislocation loops is extracted from the image data in step 36. The information (physical amount) regarding the dislocation loops is supplied to the process simulation apparatus calculation part 403.

Figure 20:
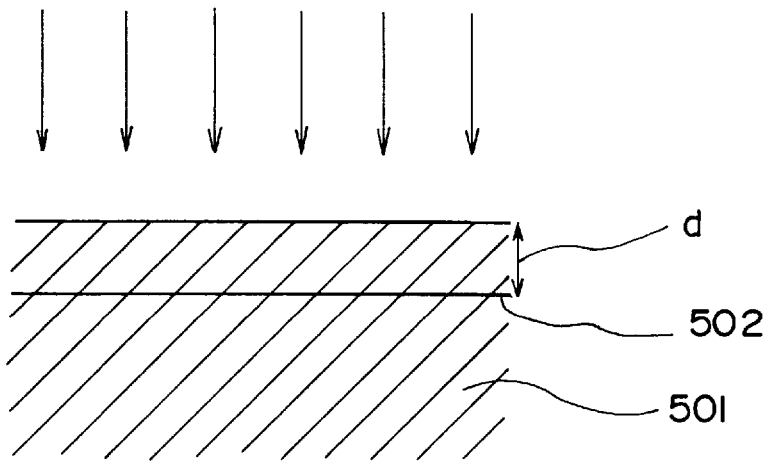
FIG. 20 is an illustration for explaining a depth of a dislocation loop layer.
Figure 21:
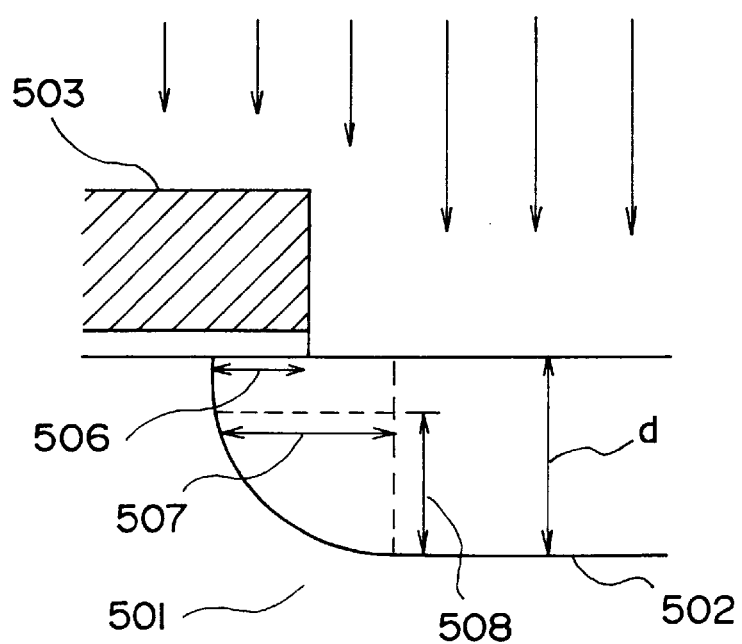
FIG. 21 is an illustration for explaining location information when the dislocation loop layer has a curved segment.
Figure 22:
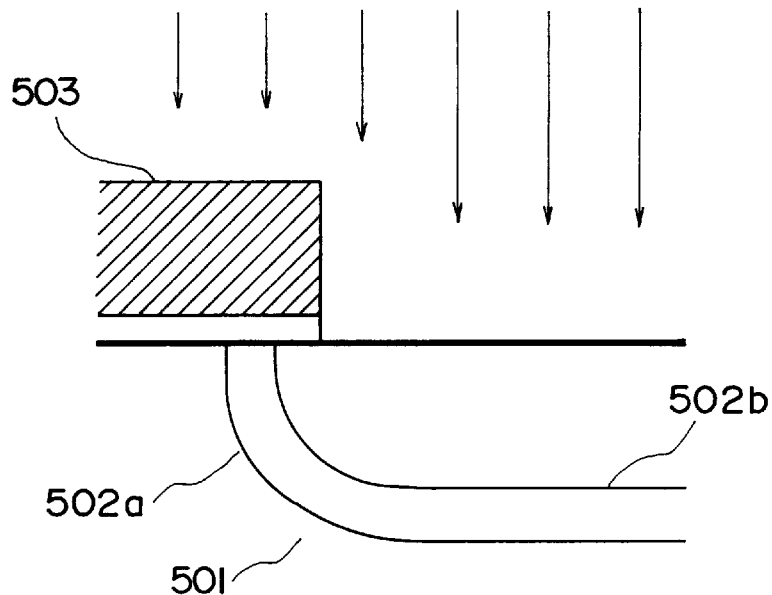
FIG. 22 is an illustration for explaining a case in which a plurality of dislocation loop layers are formed.

In the process of step S34 performed by the physical amount extracting part 412, the location information is extracted based on the determination as to whether the information is available only for the depth d of a dislocation loop layer 502 in the silicon wafer 501 as shown in FIG. 20. Additionally, the location information is extracted based on the determination as to whether the information is available for two-dimensional configuration as shown in FIG. 21. In FIG. 21, the dislocation loop layer 502 is formed in the silicon wafer 501 due to implantation of ions. A gate 503 which serves as a mask is formed on a surface of the silicon wafer 501. Thus, the dislocation loop layer 502 is curved near the gate 503. In FIG. 21, a distance from the dislocation layer 502 to an edge of the mask 503 is illustrated by an arrow 506. A dimension indicated by an arrow 507 corresponds to a parameter A which represents a configuration of the dislocation loop layer 502 in a direction parallel to the surface of the silicon wafer 501. A dimension indicated by an arrow 508 corresponds to a parameter B which represents a configuration of the dislocation loop layer 502 in a direction perpendicular to the surface of the silicon wafer 501. In the case of FIG. 21, the location information includes the depth d, the distance 506 and the dimensions 507 and 508. Further, the location information is extracted based on the determination as to whether a plurality of location loop layers are formed in the silicon wafer 501 as shown in FIG. 22. In FIG. 22, two dislocation loop layers 502a and 502b are formed in the silicon wafer 501.

According to the present embodiment, the information regarding the dislocation loops can be automatically extracted from the image data obtained from the photographic image of either of a plan view image and the cross-sectional image.

Eleventh Embodiment

Figure 23:
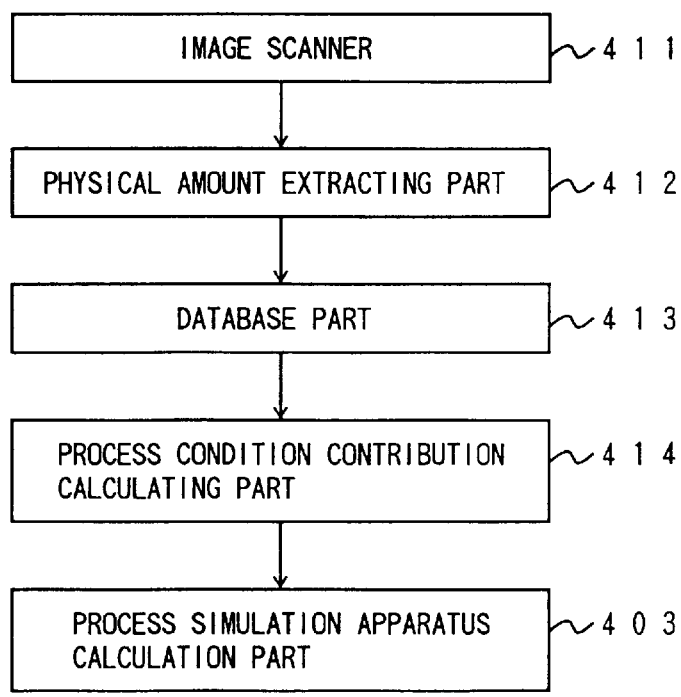
FIG. 23 is a block diagram of a semiconductor manufacturing process simulation apparatus according to an eleventh embodiment of the present invention.

FIG. 23 is a block diagram of a semiconductor manufacturing process simulation apparatus according to an eleventh embodiment of the present invention. In FIG. 23, parts that function the same as the parts shown in FIG. 19 are given the same reference numerals, and descriptions thereof will be omitted.

In this embodiment, the information (physical amount) regarding the dislocation loop is supplied to a data base part 413. In the data base part 413, the information is arranged for each condition of processes, and stored in a database. The information stored in the database is used when the diffusion model which considers influence or contribution of the dislocation loop is used for simulation. However, if information in the database is insufficient for execution of simulation, the information in the database of the database part 413 is supplied to a process condition contribution calculating part 414 so as to obtain information (physical amount) necessary for executing the simulation.

Figure 24:
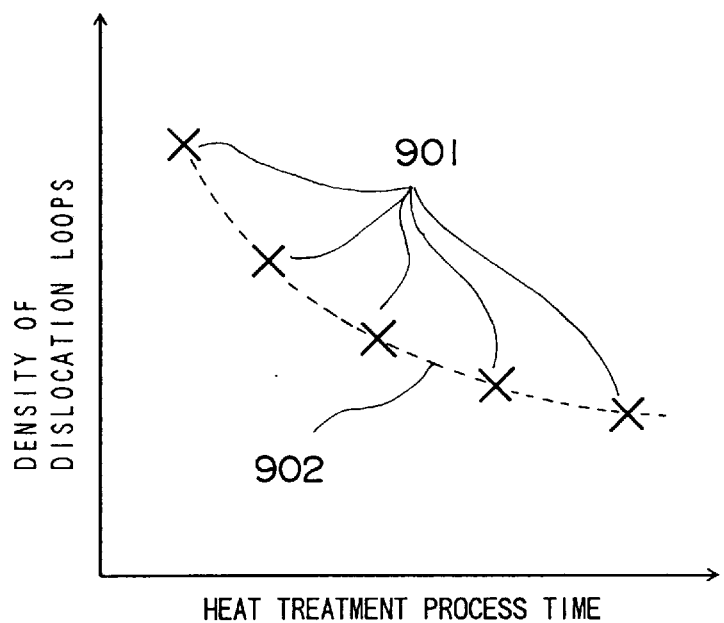
FIG. 24 is a graph for explaining calculation of necessary data based on extracted data points.

A description will now be given, with reference to FIG. 24, of a calculation of density of dislocation loops which is dependent on passage of time. In FIG. 24, data points indicated by reference numeral 901 indicate density of dislocation loops. The density information of the dislocation loops is required for each step of calculation of diffusion. Accordingly, the process condition contribution calculating part 414 selects a fitting curve which matches the data points which are extracted by the physical amount extracting unit 412 and stored in the database part 413. The information of the fitting curve is supplied to the process simulation apparatus calculation part 403 so as to be used for generating a diffusion model.

In the example shown in FIG. 24, although the information regarding the density of dislocation loops is obtained by selecting a fitting curve which matches the data points, the curve connecting the data points may be obtained by an interpolation method. Additionally, although the example shown in FIG. 24 is related to the change in the density of dislocation loops with respect to time, other information (physical amount) of the dislocation loops which is necessary for the simulation of diffusion may be calculated by the process condition contribution calculating part 414 so as to be used for generating the diffusion model.

Twelfth Embodiment

Figure 25:
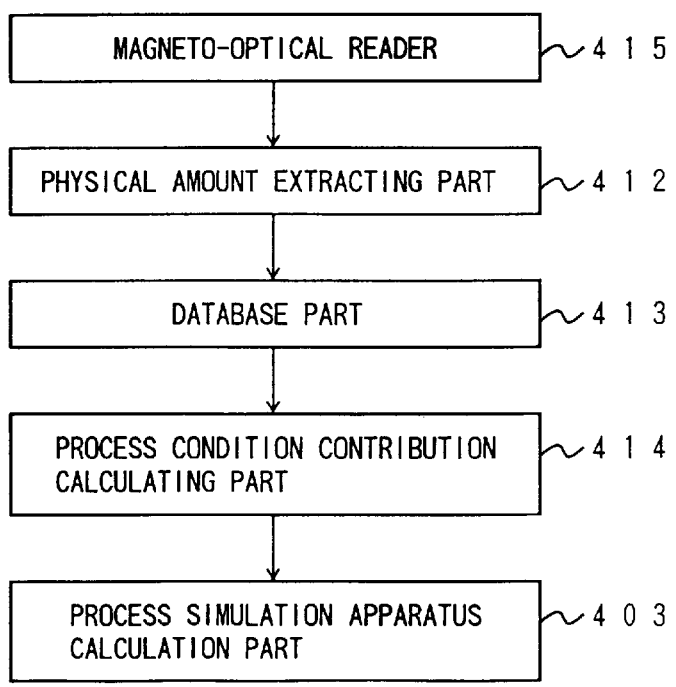
FIG. 25 is a block diagram of a semiconductor manufacturing process simulation apparatus according to a twelfth embodiment of the present invention.

FIG. 25 is a block diagram of a semiconductor manufacturing process simulation apparatus according to a twelfth embodiment of the present invention. In FIG. 25, parts that function the same as the parts shown in FIG. 23 are given the same reference numerals, and descriptions thereof will be omitted.

In the present embodiment, a magneto-optical reader 415 is provided instead of the image reader 411 in the eleventh embodiment shown in FIG. 23. The magneto-optical reader 415 reads image data obtained by a transmission electron microscope which is recorded on a magneto-optical disc. The image data read by the magneto-optical reader 415 is supplied to the physical amount extracting part 412. Then, a process the same as that of the eleventh embodiment is performed in the semiconductor manufacturing process simulation apparatus according to the present embodiment.

It should be noted that the image data may be obtained from a magnetic disc by using a magnetic reader instead of the magneto-optical reader 415. Additionally, the image data may be input through a network line.

Figure 26:
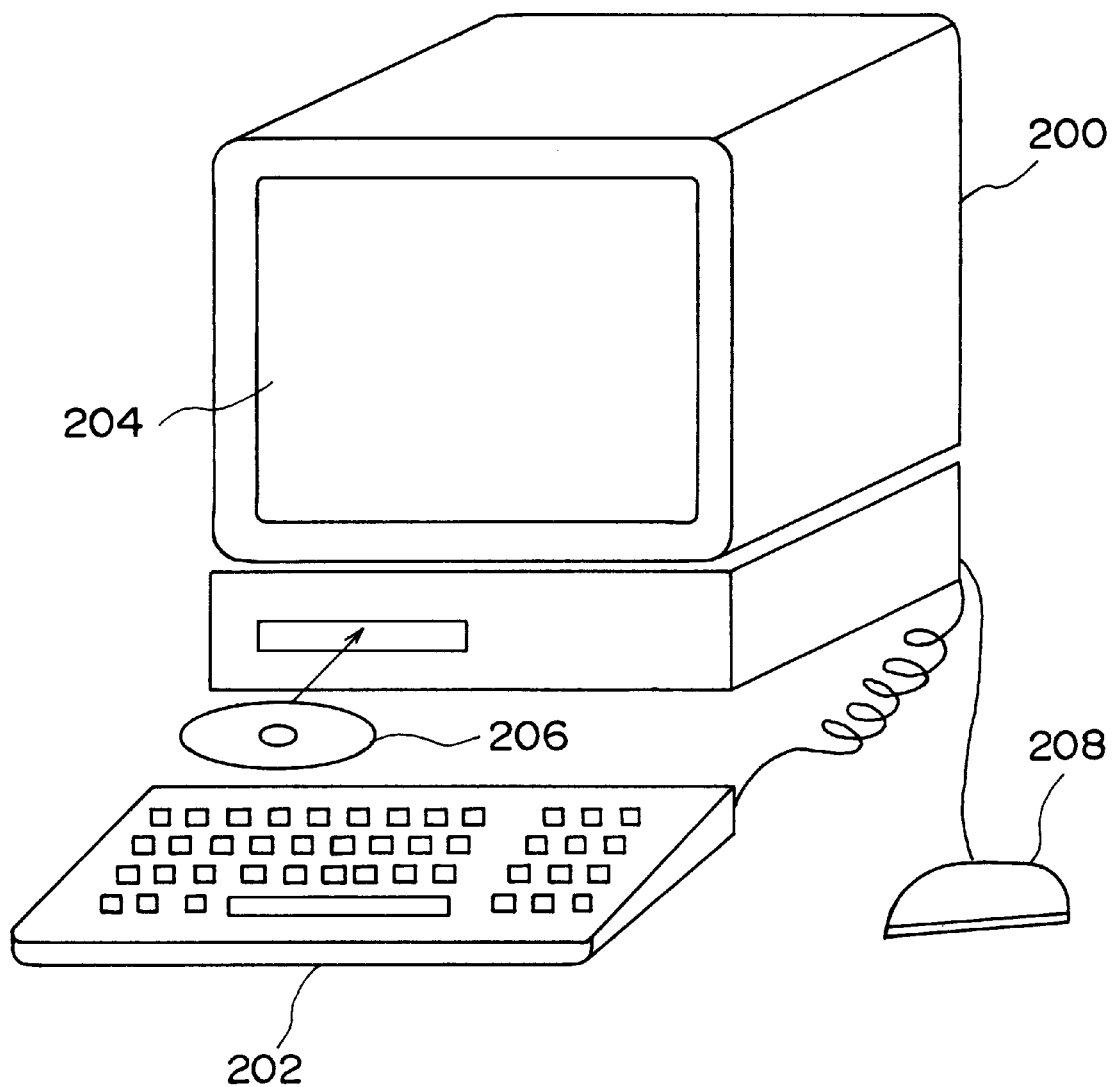
FIG. 26 is an illustration for explaining an entire structure of the embodiments according to the present invention which is achieved by a combination of a computer and computer programs.

It should be noted that all of the parts included in the above-mentioned embodiments such as the ion implantation process simulating part, the model generating part, the heat treatment process simulating part and the input/output interface can be achieved by a combination of a general purpose computer 200 as hardware and computer programs as software as shown in FIG. 26. In such a case, a keyboard 202 and a display unit 204 of the computer 200 may correspond to the input/output interface. Additionally, the computer programs may be store in a hard disc in the computer 200, or may instead be supplied in the form of a computer readable medium such as a disc 206 which stores the computer programs to perform each function of the semiconductor manufacturing process simulation apparatus according to the present invention. Additionally, a scanner 208 may correspond to the image data inputting part.

The present invention is not limited to the specifically disclosed embodiments, and variations and modifications may be made without departing from the scope of the present invention.

What is claimed is:

1. A semiconductor manufacturing process simulation apparatus for simulating a manufacturing process of a semiconductor using a substrate, comprising:
   an ion implantation process simulating part which simulates an ion implantation process;
   a model generating part which generates a diffusion model in which contribution of dislocation loops is considered, said dislocation loops being formed in said substrate during said ion implantation process; and
   a heat treatment process simulating part which simulates a heat treatment process subsequent to said ion implantation process, said diffusion model generated by said model generating part being used for simulating diffusion of impurities in said substrate during said heat treatment process,
   wherein a pressure field generated by said dislocation loops in said substrate is defined in said diffusion model by a function of a distance from a layer in which said dislocation loops are formed.

2. The semiconductor manufacturing process simulation apparatus as claimed in claim 1, wherein a location of said layer of said dislocation loops is defined in said diffusion model by a curved line including a line segment and an elliptic arc segment.

3. The semiconductor manufacturing process simulation apparatus as claimed in claim 1, wherein said model generating part calculates a saddle point representing a location of a maximum point of concentration of impurity atoms implanted into said substrate so that a location of said layer of said dislocation loops is defined in said diffusion model by a distance from said maximum point.

4. The semiconductor manufacturing process simulation apparatus as claimed in claim 1, wherein said model generating part calculates a location of a predetermined concentration of impurity atoms implanted into said substrate so that a location of said layer of said dislocation loops is defined in said diffusion model by said location of said predetermined concentration.

5. The semiconductor manufacturing process simulation apparatus as claimed in claim 1, further comprising an input/output interface including a display unit and an inputting device, said display unit displaying results of simulation performed by said ion implantation process simulating part so that a user inputs information of a location of said layer of said dislocation loops in said diffusion model while the user observes the results of simulation.

6. The semiconductor manufacturing process simulation apparatus as claimed in claim 1, wherein said heat treatment process simulating part uses said diffusion model only for a first heat treatment process after said ion implantation process.

7. The semiconductor manufacturing process simulation apparatus as claimed in claim 1, wherein said heat treatment process simulating part uses said diffusion model for a plurality of heat treatment processes subsequent to said ion implantation process, said plurality of heat treatment process including a first heat treatment process subsequent to said ion implantation process.

8. The semiconductor manufacturing process simulation apparatus as claimed in claim 1, wherein said model generating part generates a regular diffusion model in which influence of said dislocation loops is not considered so that a selected one of said diffusion model and said regular diffusion model is supplied to said heat treatment process simulating part.

9. The semiconductor manufacturing process simulation apparatus as claimed in claim 1, further comprising an input/output interface which interfaces between said semiconductor manufacturing process simulation apparatus and a user,
   wherein said model generating part comprises:
     at least two of a first model generating part, a second model generating part, a third model generating part and a fourth model generating part; and
     a switching part which switches an output of said model generating part to one of outputs from said first to fourth model generating parts,
   wherein
     said first model generating part generates said diffusion model by defining a location of said layer of said dislocation loops by a curved line including a line segment and an elliptic arc segment;
     said second model generating part calculates a saddle point representing a location of a maximum point of concentration of impurity atoms implanted into said substrate so as to generate said diffusion model in which a location of said layer of said dislocation loops is defined by a distance from said maximum point;

said third model generating part calculates a location of a predetermined concentration of impurity atoms implanted into said substrate so as to generate said diffusion model in which a location of said layer of said dislocation loops is defined by said location of said predetermined concentration; and a fourth model generating part which generates said diffusion model in which a location of said layer of said dislocation loops is input by the user while the user observes results of simulation performed by said ion implantation process simulating part via said input/output interface.

10. The semiconductor manufacturing process simulation apparatus as claimed in claim 9, wherein said heat treatment process simulating part uses said diffusion model only for a first heat treatment process after said ion implantation process.

11. The semiconductor manufacturing process simulation apparatus as claimed in claim 9, wherein said heat treatment process simulating part uses said diffusion model for a plurality of heat treatment processes subsequent to said ion implantation process, said plurality of heat treatment processes including a first heat treatment process subsequent to said ion implantation process.

12. The semiconductor manufacturing process simulation apparatus as claimed in claim 9, wherein said model generating part generates a regular diffusion model in which influence of the dislocation loop is not considered so that a selected one of said diffusion model and said regular diffusion model is supplied to said heat treatment process simulating part.

13. The semiconductor manufacturing process simulation apparatus as claimed in claim 1, further comprising an image data inputting part which inputs image data to be used by said model generating part, said image data being produced by reading a photographic image of said substrate containing said dislocation loops, said photographic image being taken by a transmission electron microscope.

14. The semiconductor manufacturing process simulation apparatus as claimed in claim 13, wherein said image data inputting part comprises an image scanner which reads said photographic image.

15. The semiconductor manufacturing process simulation apparatus as claimed in claim 13, wherein said image data inputting part comprises a digital data reading unit which reads said image data recorded on a recording medium.

16. The semiconductor manufacturing process simulation apparatus as claimed in claim 13, wherein said image data inputting part comprises an interface which interfaces said semiconductor manufacturing process simulation apparatus with an external device so that said image data is transmitted from said external device.

17. The semiconductor manufacturing process simulation apparatus as claimed in claim 13, wherein said image data inputting part determines whether said image data corresponds to a plan view of said substrate or a cross-sectional view of said substrate so that different information regarding said dislocation loops is extracted from said image data.

18. The semiconductor manufacturing process simulation apparatus as claimed in claim 17, further comprising a database part which stores said information so that said information is arranged in accordance with process conditions of said manufacturing process.

19. The semiconductor manufacturing process simulation apparatus as claimed in claim 18, further comprising a process condition contribution calculating part which calculates a contribution factor regarding said dislocation loop based on said information stored in said database part, said contribution factor being used for generating said diffusion model.

20. A computer specially configured by executing program code stored on a computer usable media for simulating a manufacturing process of a semiconductor using a substrate, the program code including:

computer-readable program code means for simulating an ion implantation process;

computer-readable program code means for generating a diffusion model in which contribution of a dislocation loop is considered, said dislocation loop being formed in said substrate during said ion implantation process;

computer-readable program code means for defining a pressure field generated by said dislocation loop in said substrate by a function of a distance from said dislocation loop; and computer-readable program code means for simulating a heat treatment process subsequent to said ion implantation process, said diffusion model being used for simulating diffusion of impurities in said substrate in said heat treatment process.

21. A processor readable medium storing program code for causing a computer to simulate a manufacturing process of a semiconductor using a substrate, comprising:

first program code means for simulating an ion implantation process;

second program code means for generating a diffusion model in which contribution of a dislocation loop is considered, said dislocation loop being formed in said substrate during said ion implantation process;

third program code means for defining a pressure field generated by said dislocation loop in said substrate by a function of a distance from said dislocation loop; and fourth program code means for simulating a heat treatment process subsequent to said ion implantation process, said diffusion model being used for simulating diffusion of impurities in said substrate in said heat treatment process.

* * * * *